(12) United States Patent
Sung et al.

(10) Patent No.: US 10,176,996 B2
(45) Date of Patent: Jan. 8, 2019

(54) REPLACEMENT METAL GATE AND FABRICATION PROCESS WITH REDUCED LITHOGRAPHY STEPS

(71) Applicant: GLOBALFOUNDRIES Inc., Grand Cayman (KY)

(72) Inventors: Min Gyu Sung, Latham, NY (US); Chanro Park, Clifton Park, NY (US); Hoon Kim, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 520 days.

(21) Appl. No.: 14/452,606

(22) Filed: Aug. 6, 2014

(65) Prior Publication Data
US 2016/0042954 A1 Feb. 11, 2016

(51) Int. Cl.
| H01L 21/8234 | (2006.01) |
|---|---|
| H01L 21/8238 | (2006.01) |
| H01L 29/66 | (2006.01) |
| H01L 29/49 | (2006.01) |
| H01L 27/092 | (2006.01) |
| H01L 21/28 | (2006.01) |
| H01L 21/3213 | (2006.01) |
| H01L 29/51 | (2006.01) |

(52) U.S. Cl.
CPC .. *H01L 21/28123* (2013.01); *H01L 21/28088* (2013.01); *H01L 21/32139* (2013.01); *H01L 21/82385* (2013.01); *H01L 21/823842* (2013.01); *H01L 21/823857* (2013.01); *H01L 27/0922* (2013.01); *H01L 29/4966* (2013.01); *H01L 29/66545* (2013.01); *H01L 29/517* (2013.01)

(58) Field of Classification Search
CPC ......... H01L 21/28044; H01L 21/76834; H01L 21/8232; H01L 21/8238; H01L 21/82385; H01L 21/823857; H01L 21/823842; H01L 21/823406; H01L 21/8234; H01L 27/10873; H01L 27/0617; H01L 27/092; H01L 29/6656; H01L 29/78; H01L 29/94; H01L 21/82345; H01L 21/823456; H01L 21/823807; H01L 21/823462
USPC ................................ 438/238, 595; 257/369
See application file for complete search history.

(56) References Cited

U.S. PATENT DOCUMENTS

| 7,071,529 | B2 | 7/2006 | Miyagawa et al. |
| 8,722,491 | B2 | 5/2014 | Park et al. |
| 2005/0095852 | A1* | 5/2005 | Saenger ............ H01L 21/28088 438/672 |
| 2005/0095867 | A1* | 5/2005 | Shimada .................. C23F 4/00 438/720 |
| 2011/0156107 | A1* | 6/2011 | Bohr ................ H01L 21/76831 257/288 |
| 2013/0043592 | A1* | 2/2013 | Park .................... H01L 29/4966 257/754 |

(Continued)

*Primary Examiner* — Natalia A Gondarenko
(74) *Attorney, Agent, or Firm* — Williams Morgan, P.C.

(57) ABSTRACT

Embodiments of the present invention provide a replacement metal gate and a fabrication process with reduced lithography steps. Using selective etching techniques, a layer of fill metal is used to protect the dielectric layer in the trenches, eliminating the need for some lithography steps. This, in turn, reduces the overall cost and complexity of fabrication. Furthermore, additional protection is provided during etching, which serves to improve product yield.

16 Claims, 49 Drawing Sheets

(56) References Cited

U.S. PATENT DOCUMENTS

| | | | |
|---|---|---|---|
| 2013/0187236 A1* | 7/2013 | Xie | H01L 29/4966 257/369 |
| 2013/0302980 A1* | 11/2013 | Chandrashekar | H01L 21/76877 438/666 |
| 2014/0110778 A1* | 4/2014 | Fumitake | H01L 29/78 257/330 |
| 2015/0087144 A1* | 3/2015 | Liu | H01L 21/02074 438/595 |

* cited by examiner

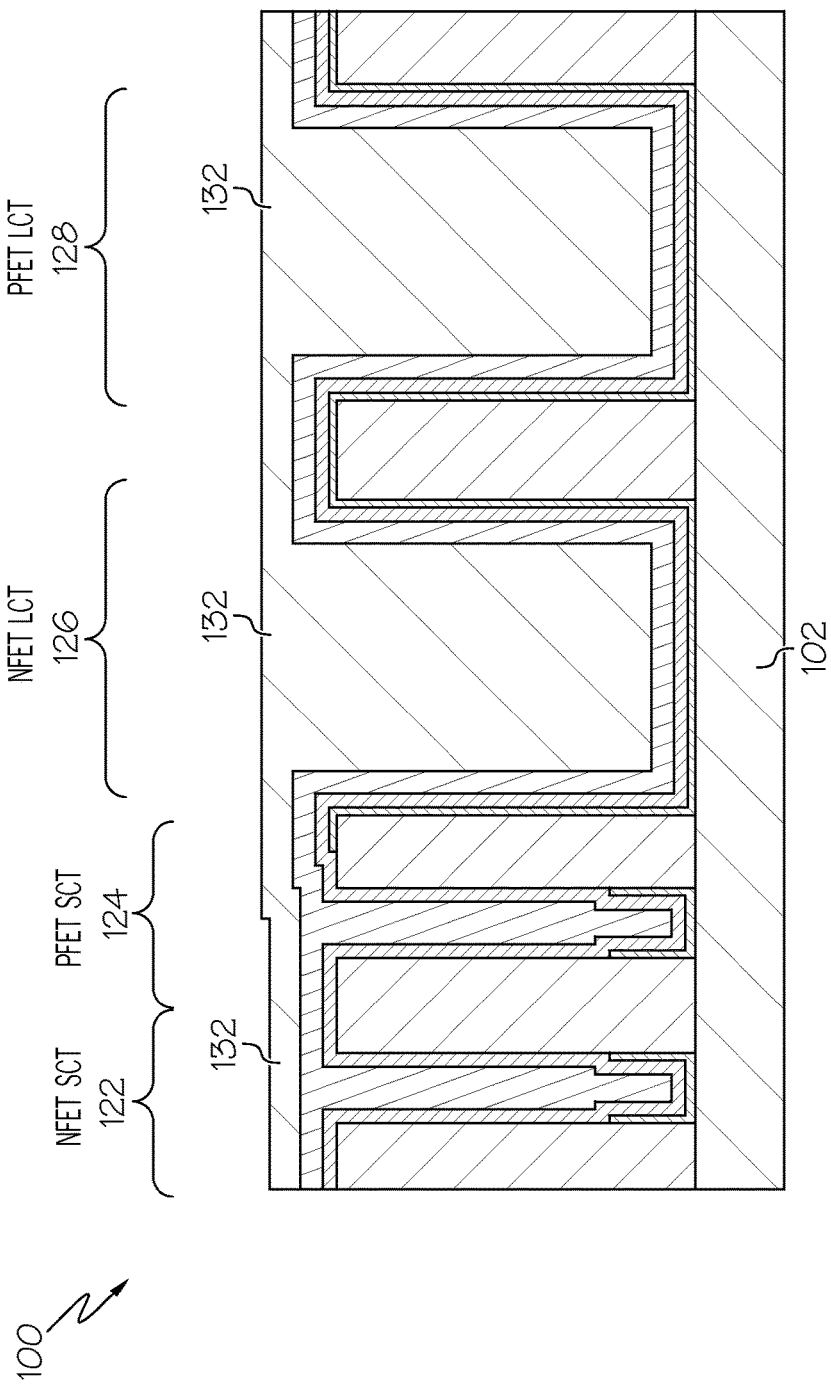

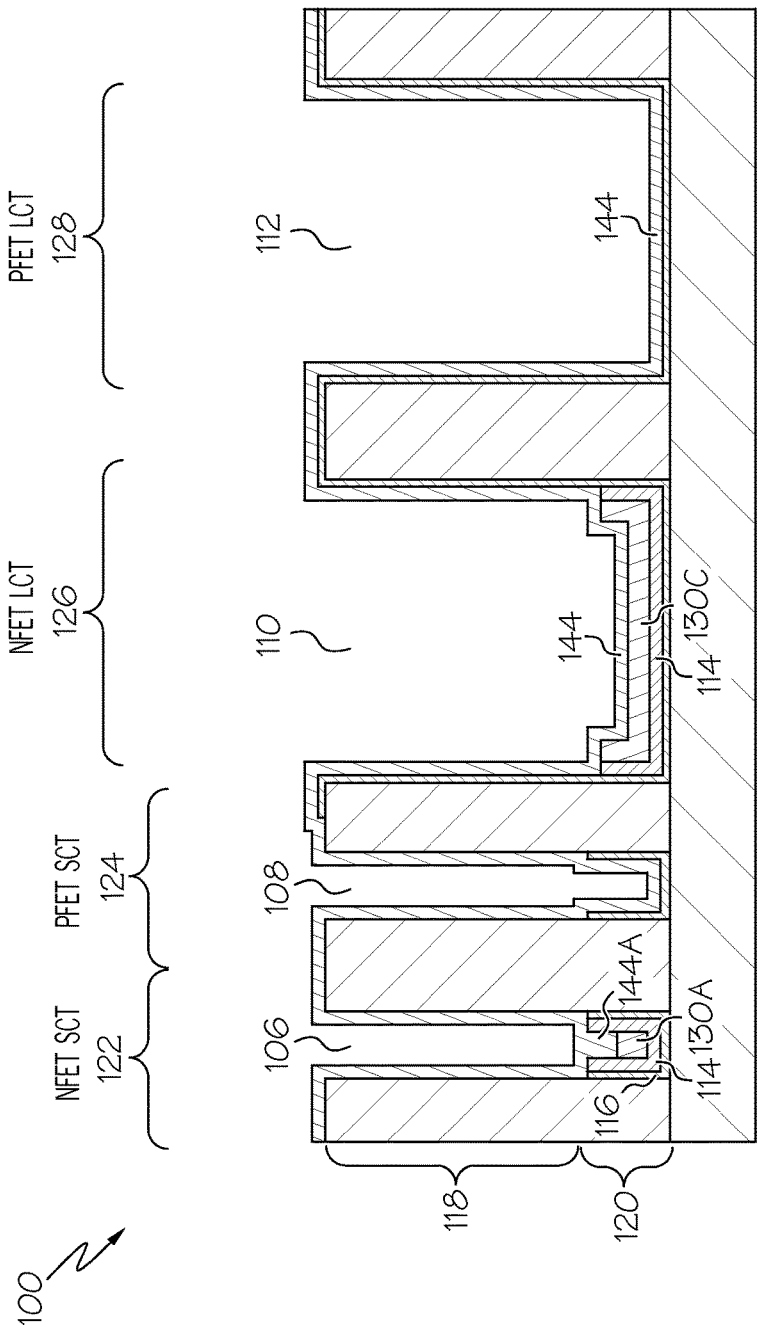

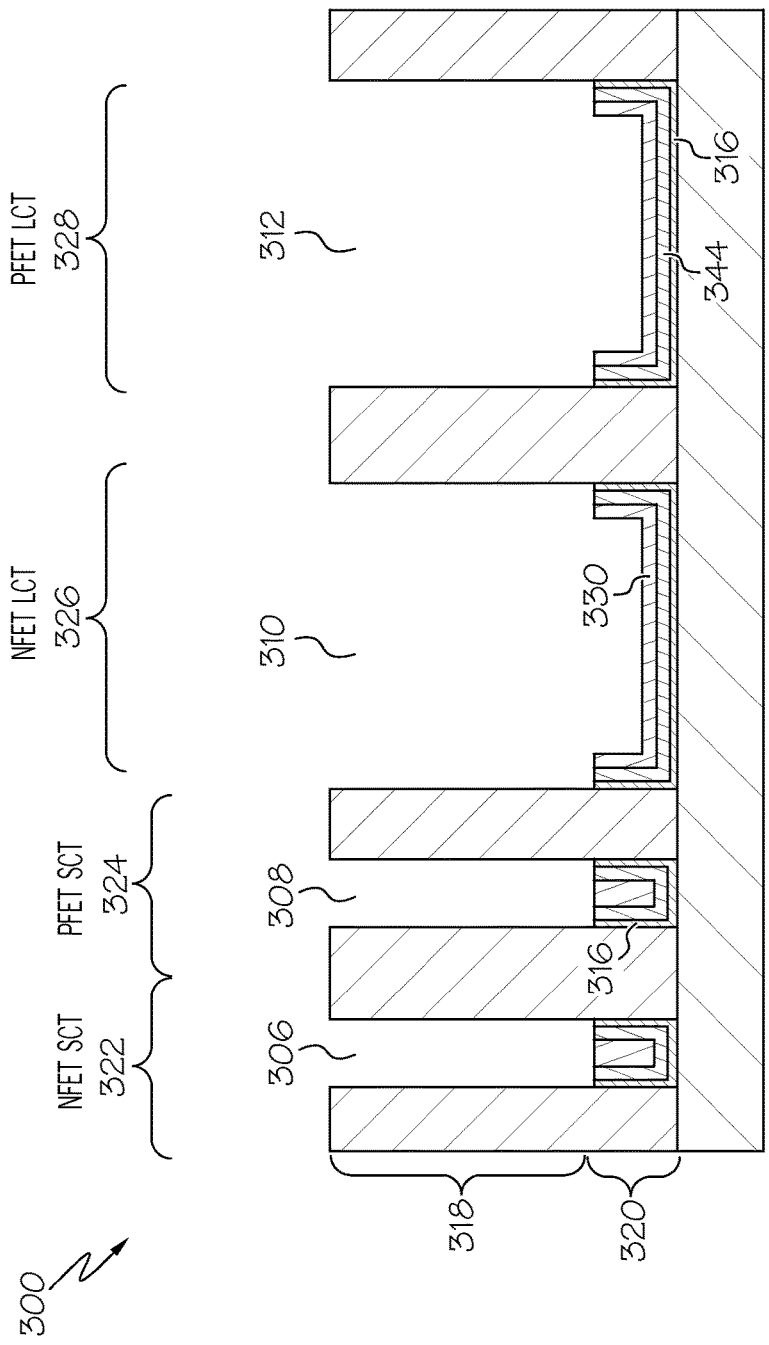

US 10,176,996 B2

REPLACEMENT METAL GATE AND FABRICATION PROCESS WITH REDUCED LITHOGRAPHY STEPS

FIELD OF THE INVENTION

The present invention relates generally to semiconductor fabrication, and more particularly, to a replacement metal gate and fabrication process.

BACKGROUND

Conventional polysilicon gate stacks have become increasingly unsuitable due to excessive gate leakage as the gate dielectric is proportionally thinned as gate length is decreased. The introduction of novel gate stack materials including high-K (HK) dielectric materials and metal gates has enabled the continuation of Moore's Law.

In a replacement metal gate (RMG), or "gate last" process, the polysilicon gate is replaced with a metal gate stack. P-type field effect transistors (PFETs) and N-type field effect transistors (NFETs) utilize different metal stacks to achieve a desired work function, and thus enable a desired threshold voltage. The use of different metals in adjacent devices typically requires numerous, time-consuming steps to fabricate them. Therefore, it is desirable to have improvements in replacement metal gates and fabrication methods to reduce time and cost of fabrication.

SUMMARY

Embodiments of the present invention provide a replacement metal gate and a fabrication process with reduced lithography steps. Using selective etching techniques, a layer of fill metal is used to protect the dielectric layer in the trenches, eliminating the need for some lithography steps. This, in turn, reduces the overall cost and complexity of fabrication. Furthermore, additional protection is provided during etching, which serves to improve product yield.

In a first aspect, embodiments of the present invention provide a method of forming a semiconductor structure, comprising: forming an nFET short channel trench (SCT), a pFET SCT, an nFET long channel trench (LCT), and a pFET LCT in a dielectric layer that is disposed on a semiconductor substrate; depositing a high-K dielectric layer in the nFET SCT, pFET SCT, nFET LCT, and pFET LCT; depositing an N type work function metal in the nFET SCT, pFET SCT, nFET LCT, and the pFET LCT; performing a high-K dielectric chamfer process on the nFET SCT and pFET SCT; depositing a metal layer in the nFET SCT, pFET SCT, nFET LCT, and the pFET LCT, such that the metal layer is deposited conformally in the nFET LCT and the pFET LCT, and wherein the metal layer fills the nFET SCT and the pFET SCT; depositing a first organic planarization layer in the nFET LCT and the pFET LCT; performing a recess of the metal layer; and depositing a second organic planarization layer in the nFET SCT, pFET SCT, nFET LCT, and the pFET LCT.

In a second aspect, embodiments of the present invention provide a method of forming a semiconductor structure, comprising: forming an nFET short channel trench (SCT), a pFET SCT, an nFET long channel trench (LCT), and a pFET LCT in a dielectric layer that is disposed on a semiconductor substrate; depositing a high-K dielectric layer in the nFET SCT, pFET SCT, nFET LCT, and pFET LCT; depositing an N type work function metal in the nFET SCT, pFET SCT, nFET LCT, and pFET LCT; performing a high-K dielectric chamfer process on the nFET SCT and pFET SCT; depositing a metal layer in the nFET SCT, pFET SCT, nFET LCT, and pFET LCT, such that the metal layer is deposited conformally in the nFET LCT and a pFET LCT while filling the nFET SCT and pFET SCT; depositing a first organic planarization layer in the nFET LCT and the pFET LCT; performing a partial recess of the metal layer such that the remaining metal layer completely fills a non-chamfered region of the nFET SCT and pFET SCT; recessing the N type work function metal; and removing the first organic planarization layer in the nFET LCT and the pFET LCT.

In a third aspect, embodiments of the present invention provide A semiconductor structure comprising: an nFET short channel trench (SCT); a pFET SCT; an nFET long channel trench (LCT); a pFET LCT; wherein the nFET LCT comprises: a high-K dielectric layer disposed along a bottom surface of the nFET LCT; an n-type work function material layer disposed on the high-K dielectric layer; a first tungsten layer disposed on the n-type work function material layer; a titanium nitride layer disposed on the first tungsten layer; a second tungsten layer disposed on the titanium nitride layer; and a capping layer disposed on the second tungsten layer.

BRIEF DESCRIPTION OF THE DRAWINGS

The accompanying drawings, which are incorporated in and constitute a part of this specification, illustrate several embodiments of the present teachings and, together with the description, serve to explain the principles of the present teachings.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1A:
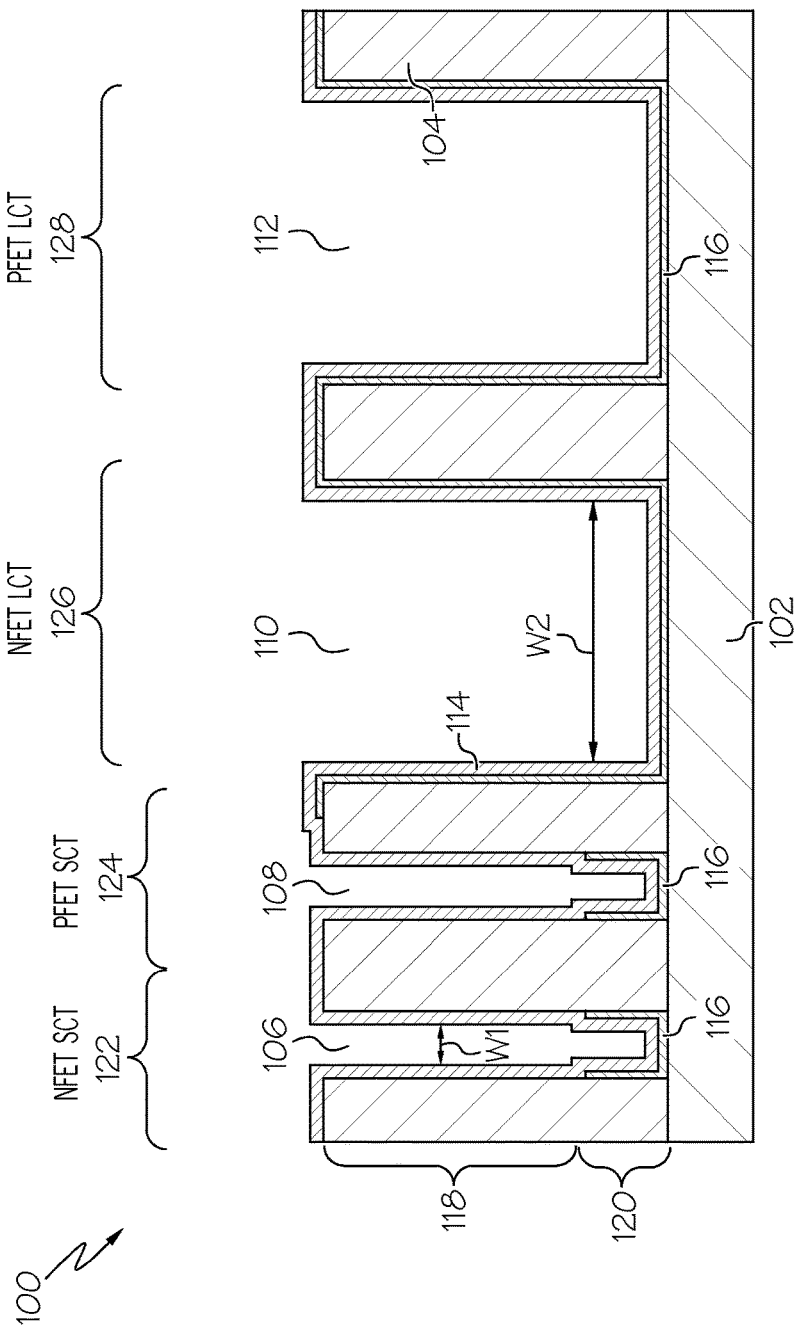

Often, similar elements may be referred to by similar numbers in various figures (FIGs) of the drawing, in which case, typically the last two significant digits may be the same, the most significant digit being the number of the drawing figure (FIG). Furthermore, for clarity, some reference numbers may be omitted in certain drawings.

FIG. 1A is a semiconductor structure at a starting point for embodiments of the present invention.

Figure 1B:
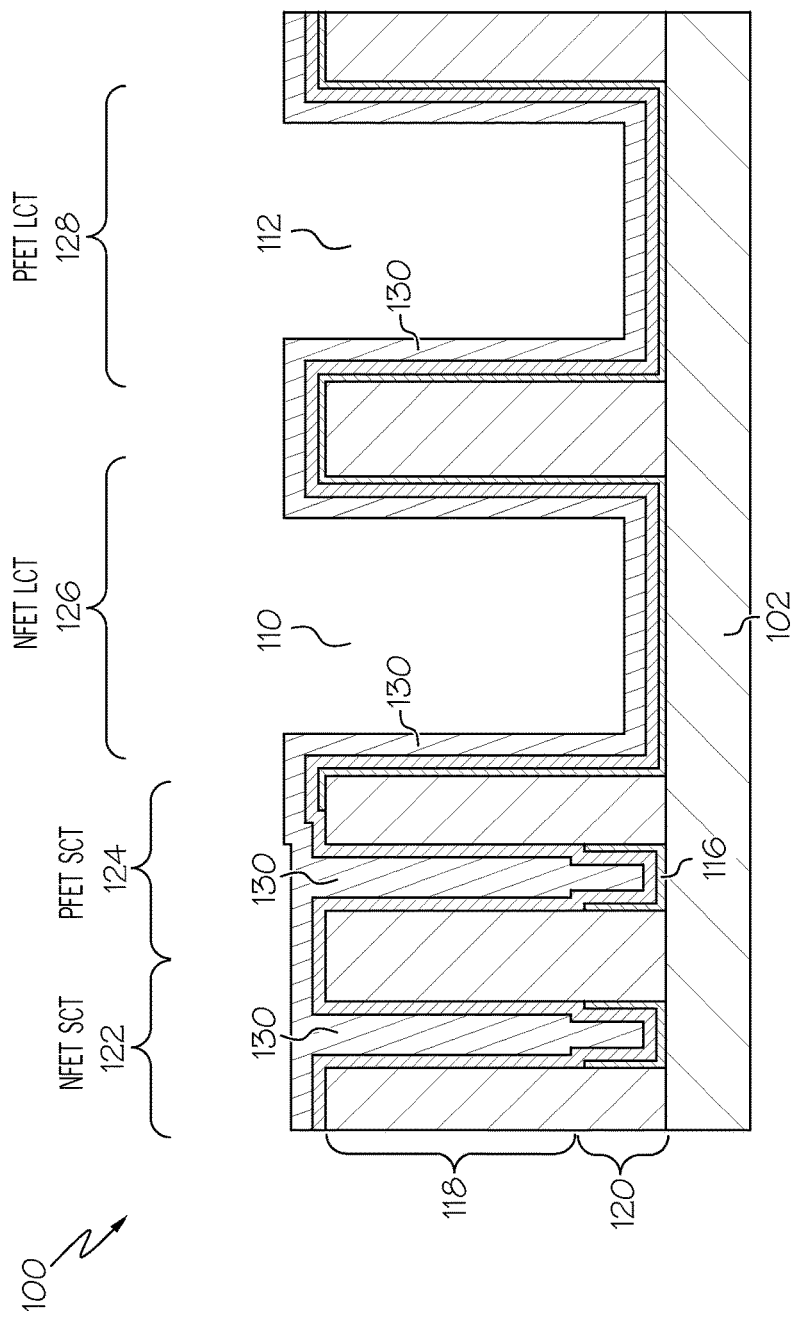

FIG. 1B is a semiconductor structure after a subsequent process step of depositing a metal layer.

FIG. 1C is a semiconductor structure after a subsequent process step of depositing an organic planarization layer.

Figure 1D:
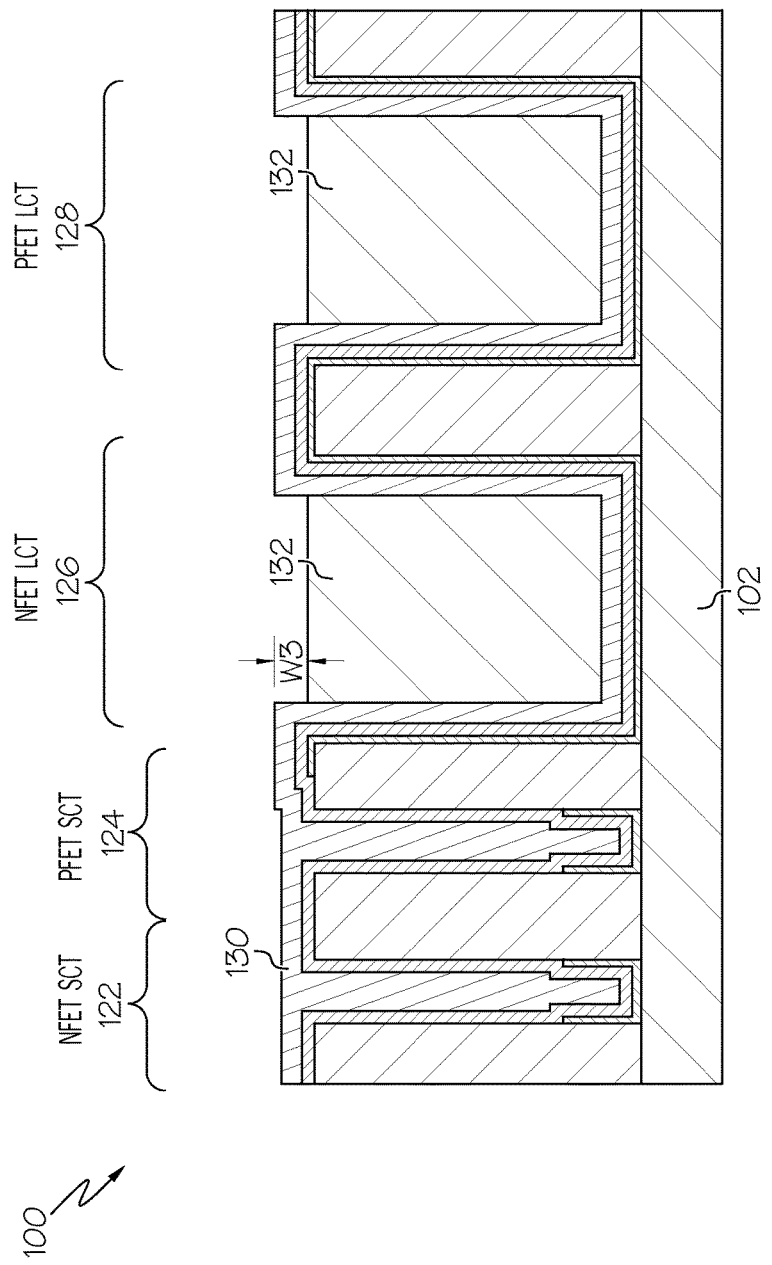

FIG. 1D is a semiconductor structure after a subsequent process step of recessing the organic planarization layer material.

Figure 1E:
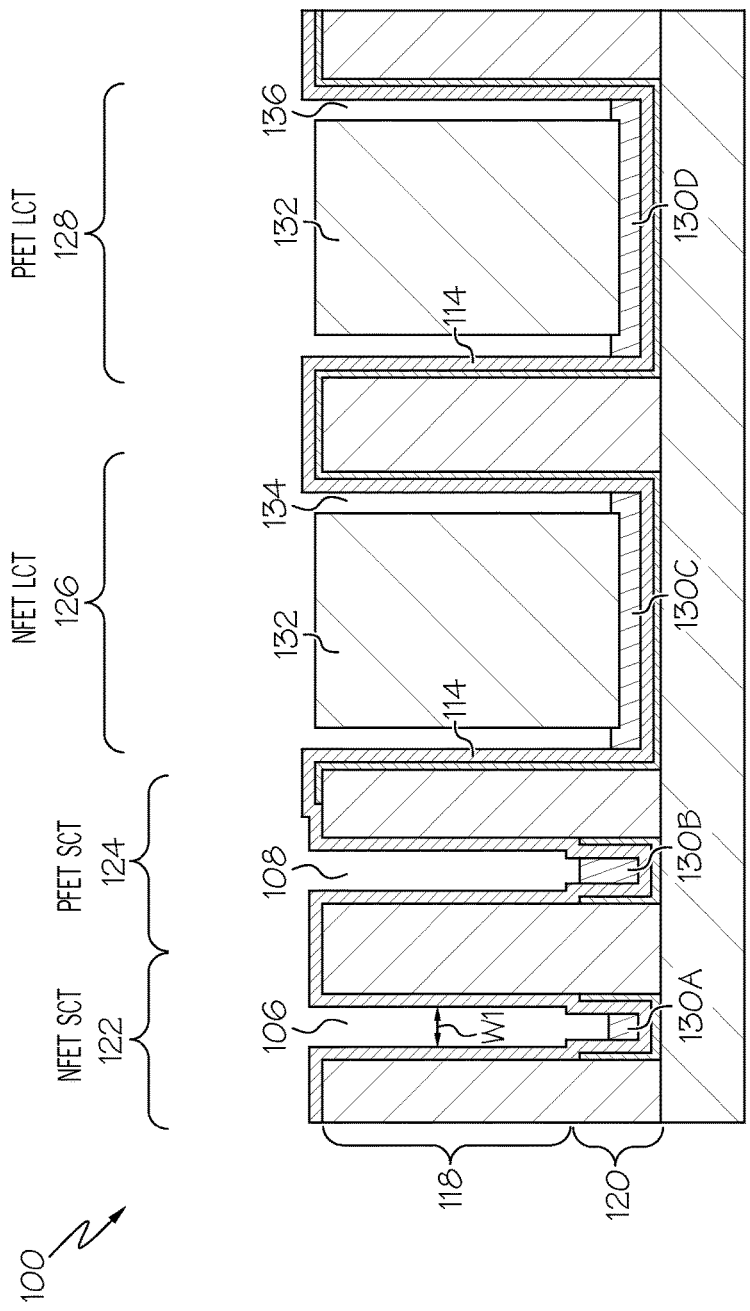

FIG. 1E is a semiconductor structure after a subsequent process step of recessing the metal layer.

Figure 1F:
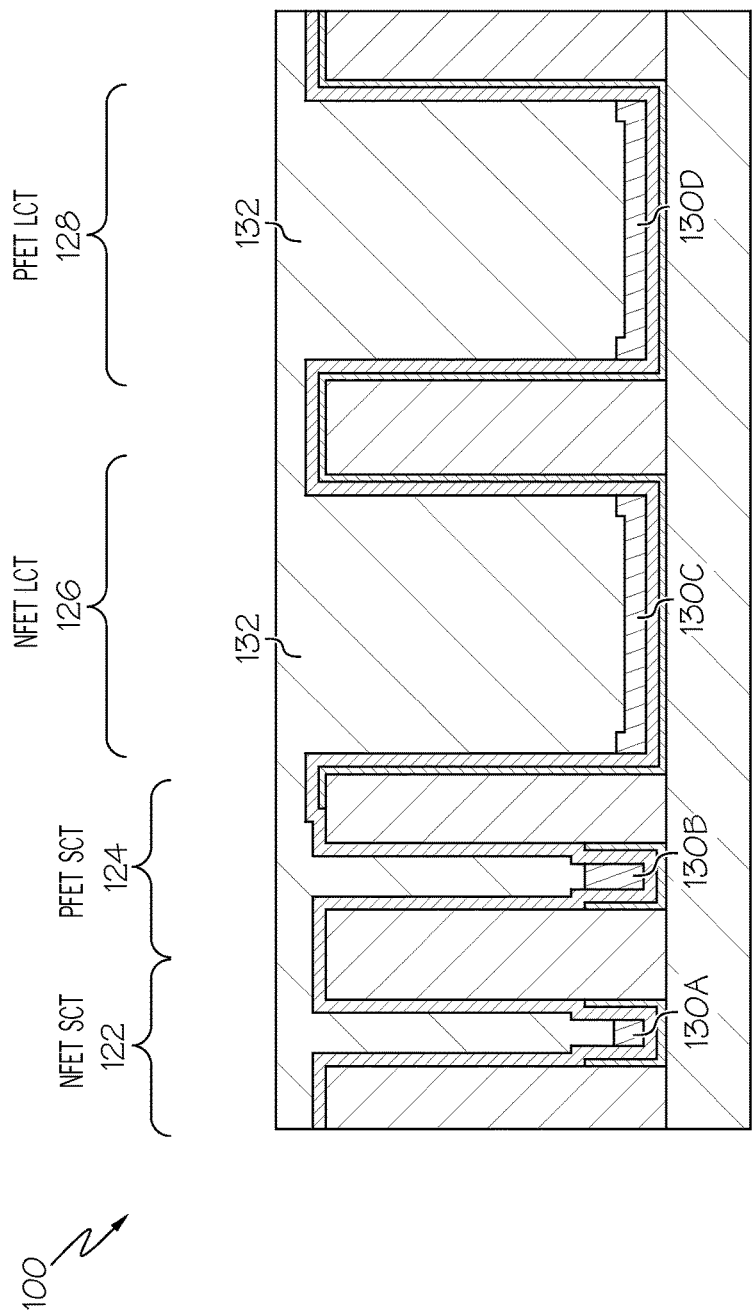

FIG. 1F is a semiconductor structure after a subsequent process step of depositing additional organic planarization material.

Figure 1G:
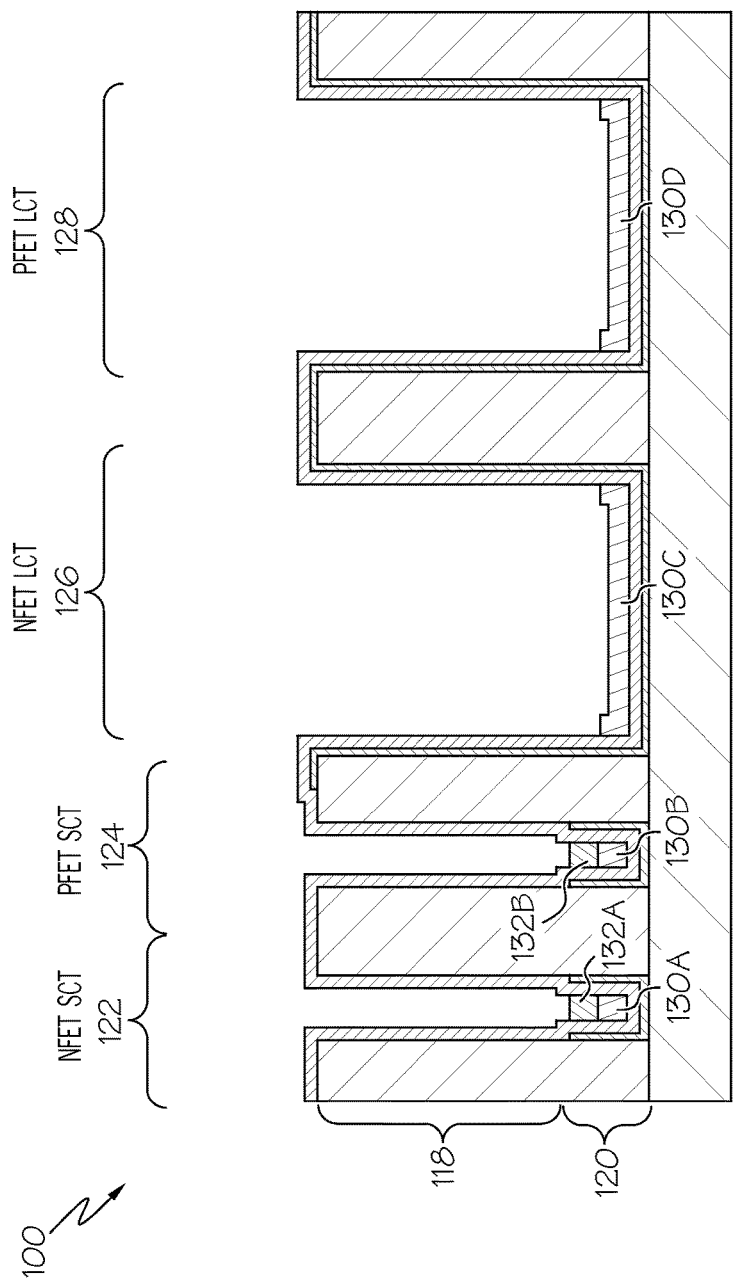

FIG. 1G is a semiconductor structure after a subsequent process step of performing a partial recess of the organic planarization layer.

Figure 1H:
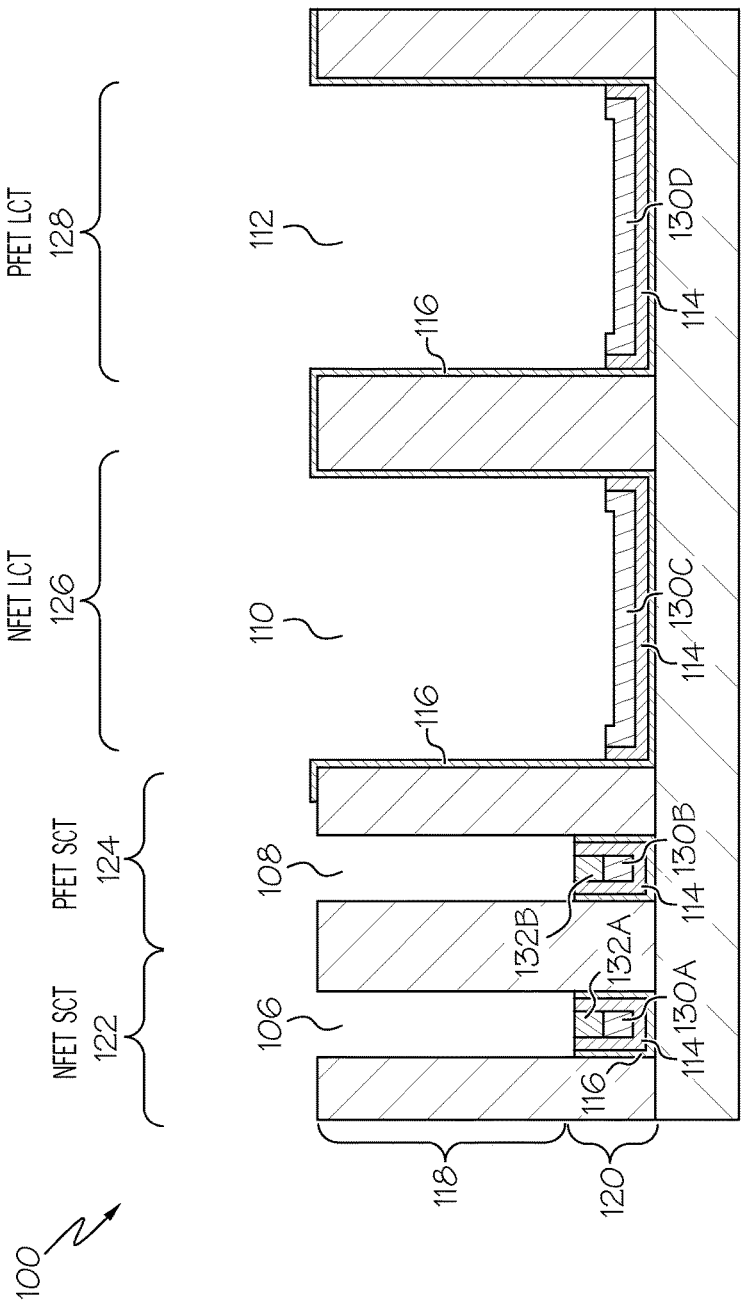

FIG. 1H is a semiconductor structure after a subsequent process step of performing a partial recess of the n-type work function metal.

Figure 1I:
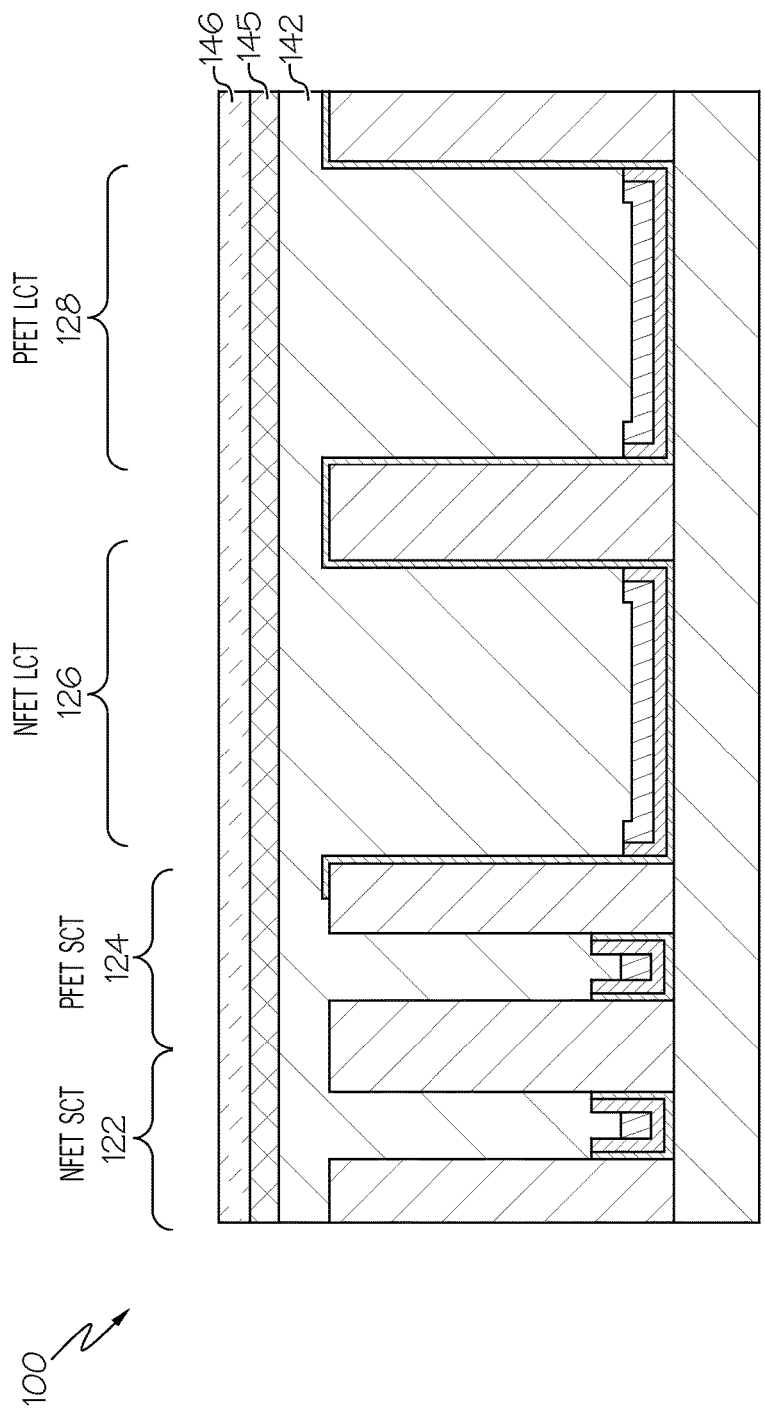

FIG. 1i is a semiconductor structure after a subsequent process step of depositing an additional lithography stack.

Figure 1J:
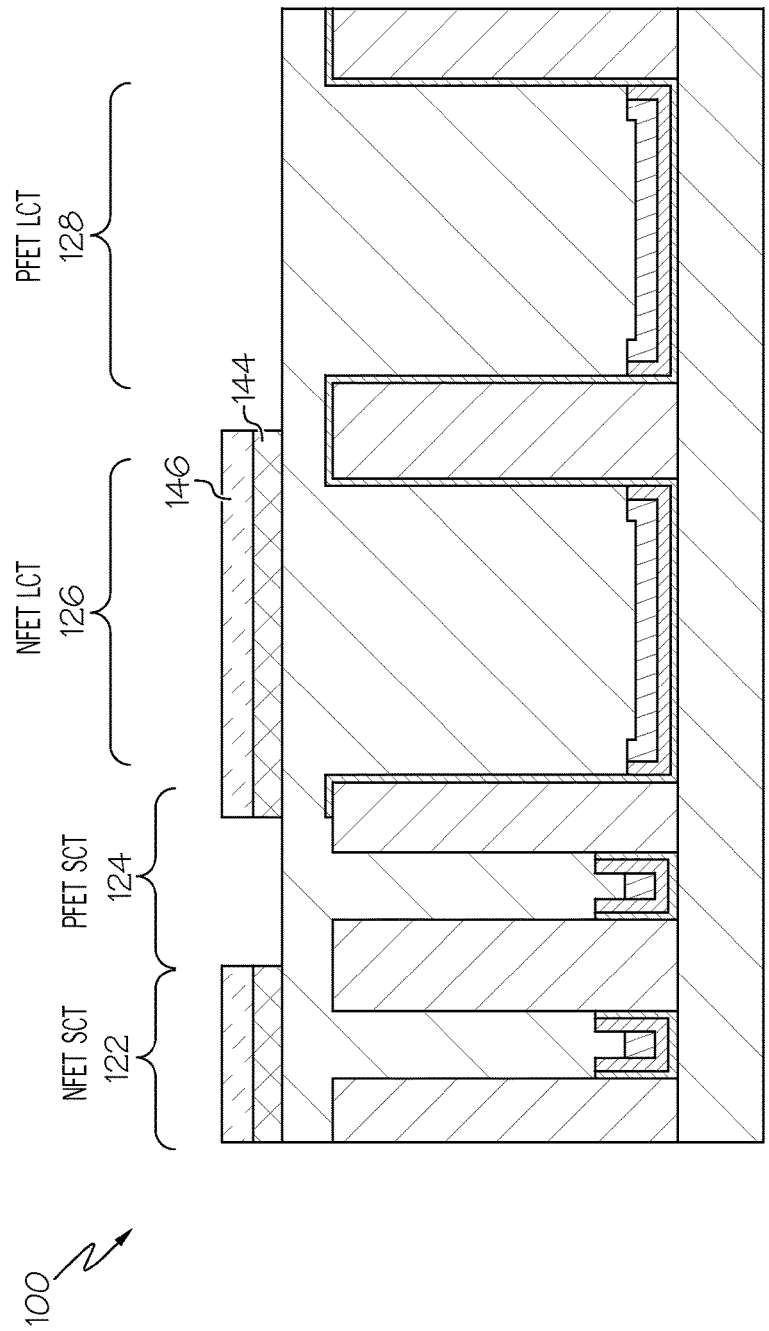

FIG. 1J is a semiconductor structure after a subsequent process step of opening the lithography stack over the PFET trenches.

Figure 1K:
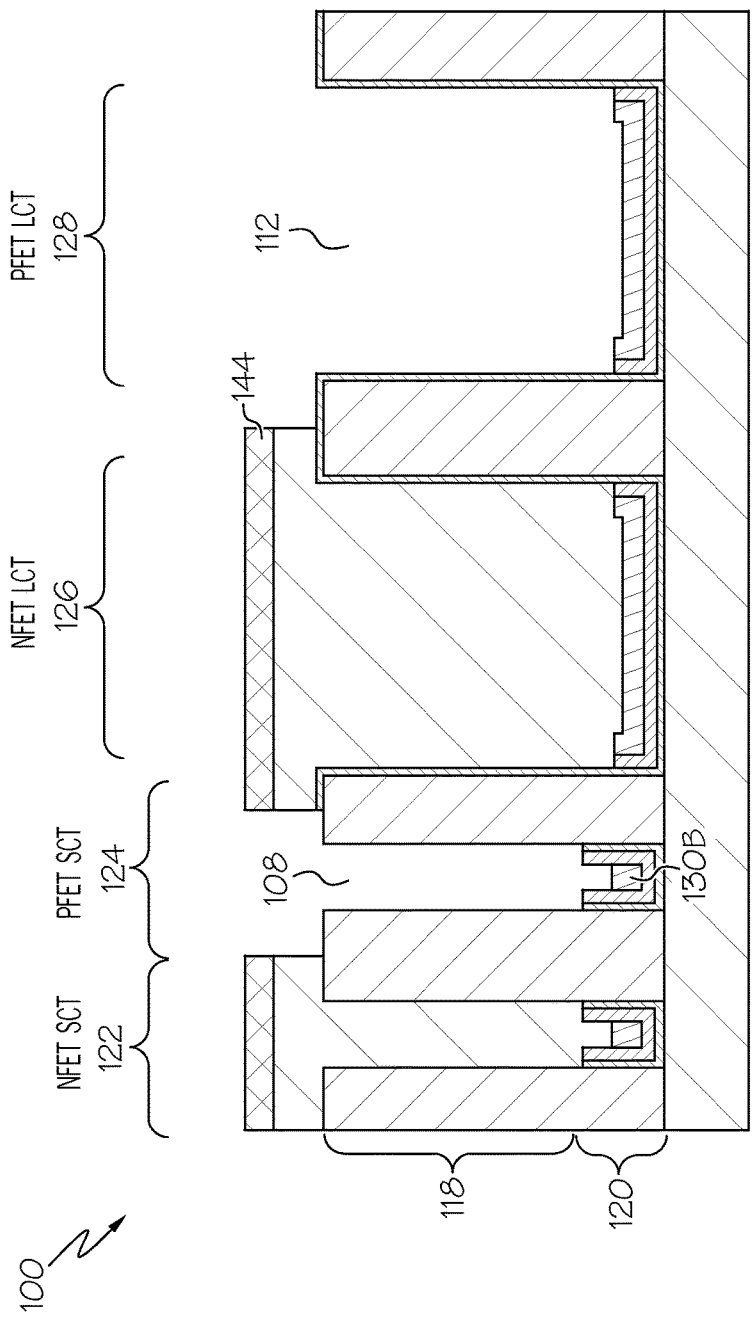

FIG. 1K is a semiconductor structure after a subsequent process step of removing the lithography stack in the PFET trenches.

Figure 1L:
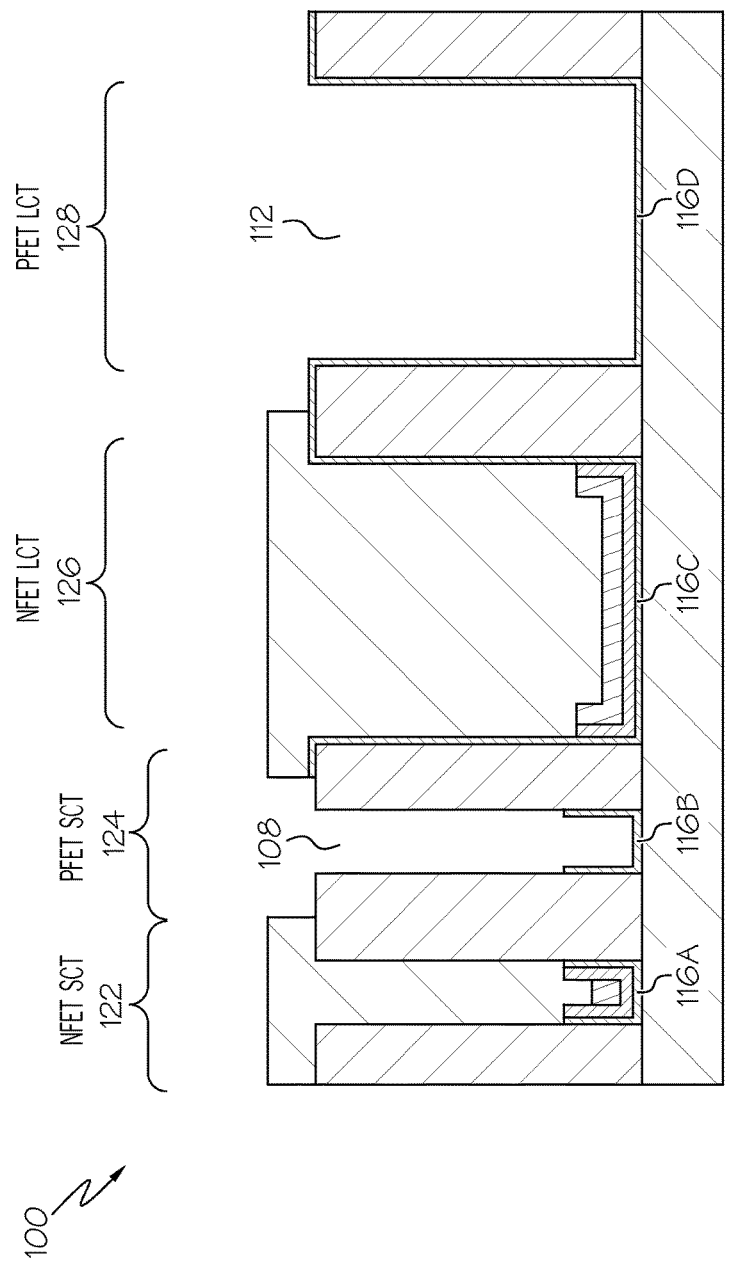

FIG. 1L is a semiconductor structure after a subsequent process step of removing the n-type work function metal in the PFET trenches.

Figure 1M:
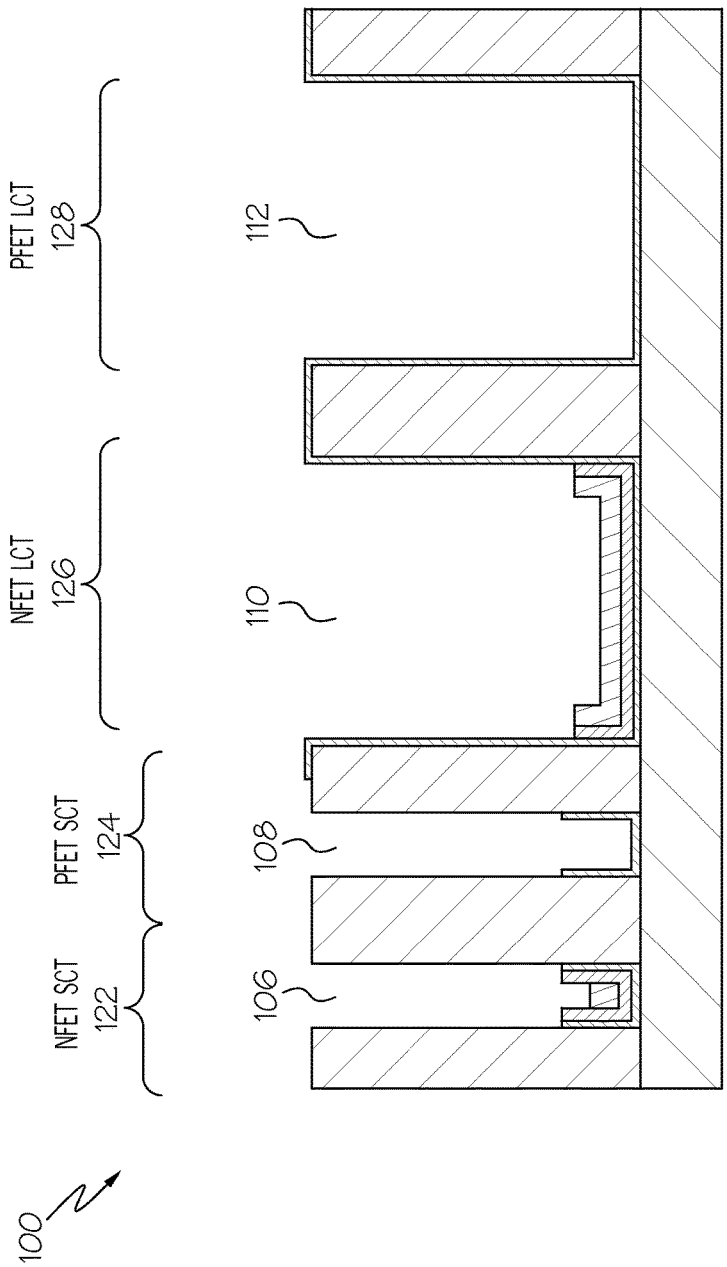

FIG. 1M is a semiconductor structure after a subsequent process step of removing the remaining organic planarization layer.

FIG. 1N is a semiconductor structure after a subsequent process step of depositing a p-type work function metal.

Figure 1O:
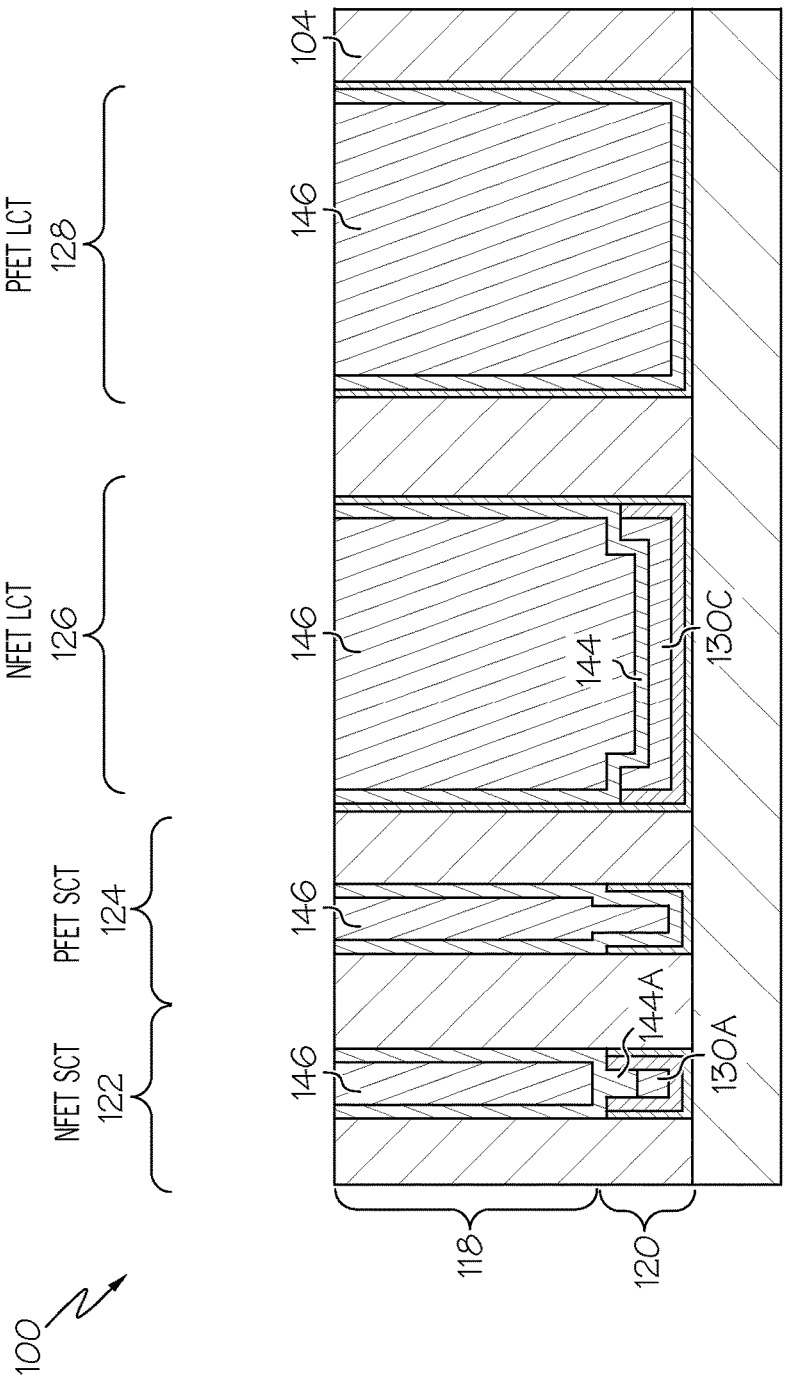

FIG. 1o is a semiconductor structure after a subsequent process step of depositing a gate fill metal.

Figure 1P:
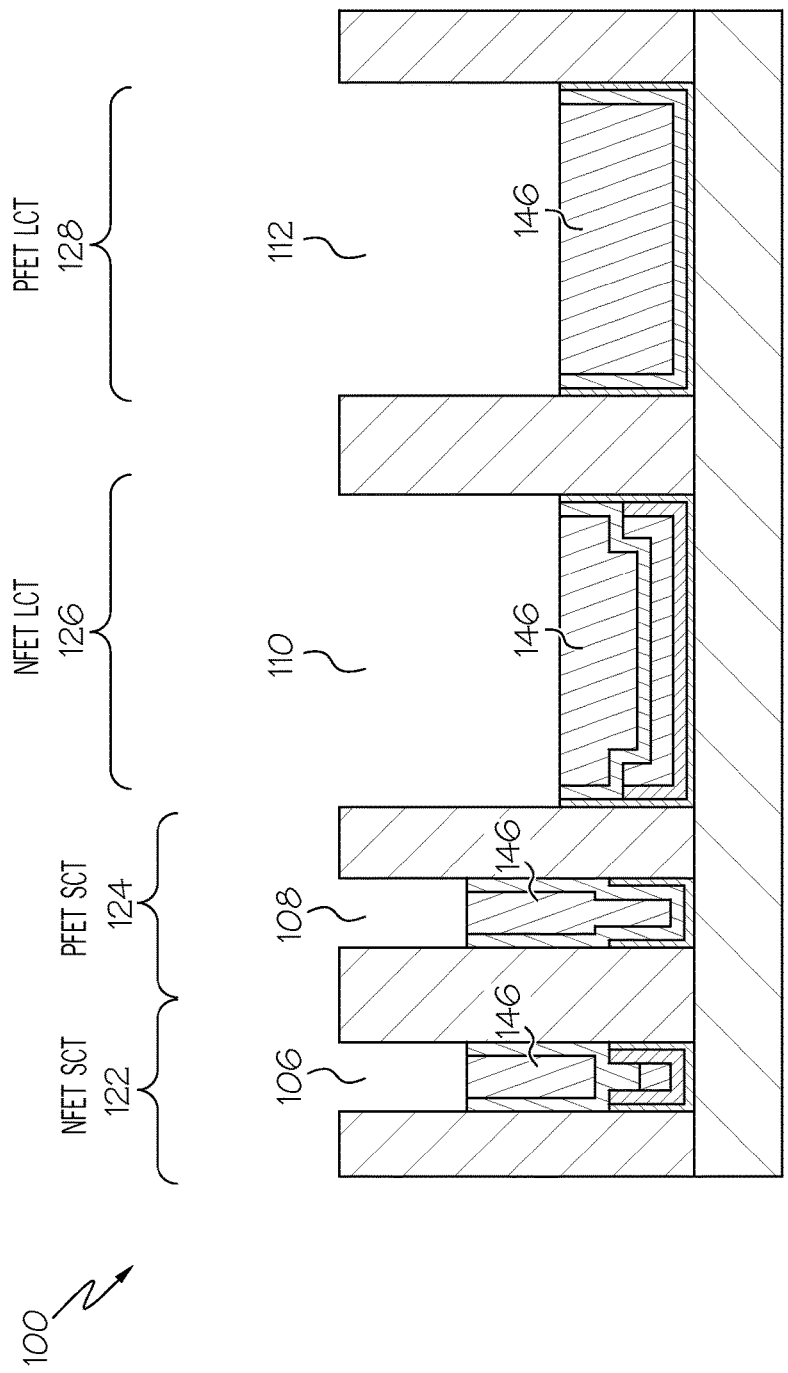

FIG. 1P is a semiconductor structure after a subsequent process step of recessing the gate fill metal.

Figure 1Q:
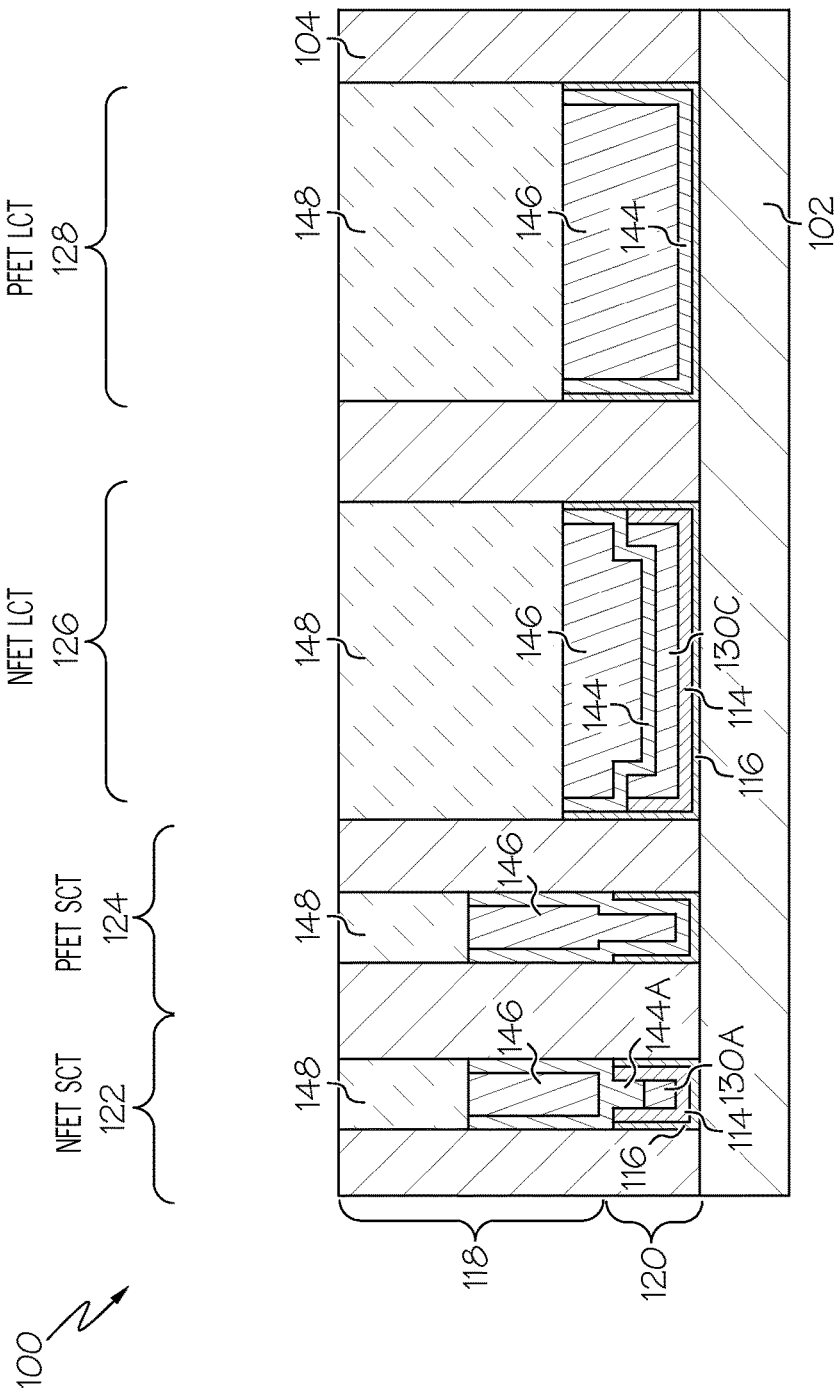

FIG. 1Q is a semiconductor structure after a subsequent process step of depositing a capping layer.

Figure 2A:
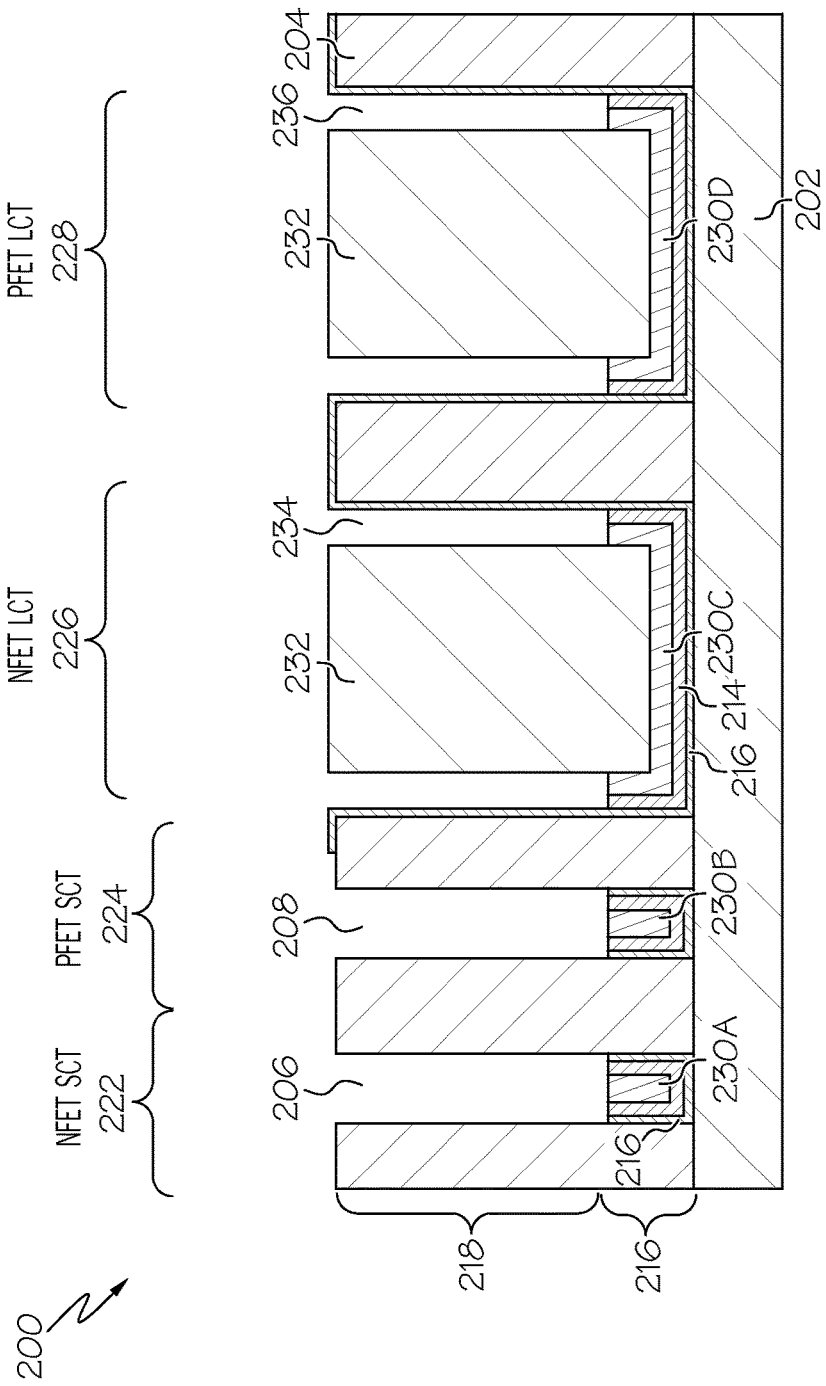

FIG. 2A is a semiconductor structure at a starting point for additional embodiments of the present invention, following from FIG. 1D.

Figure 2B:
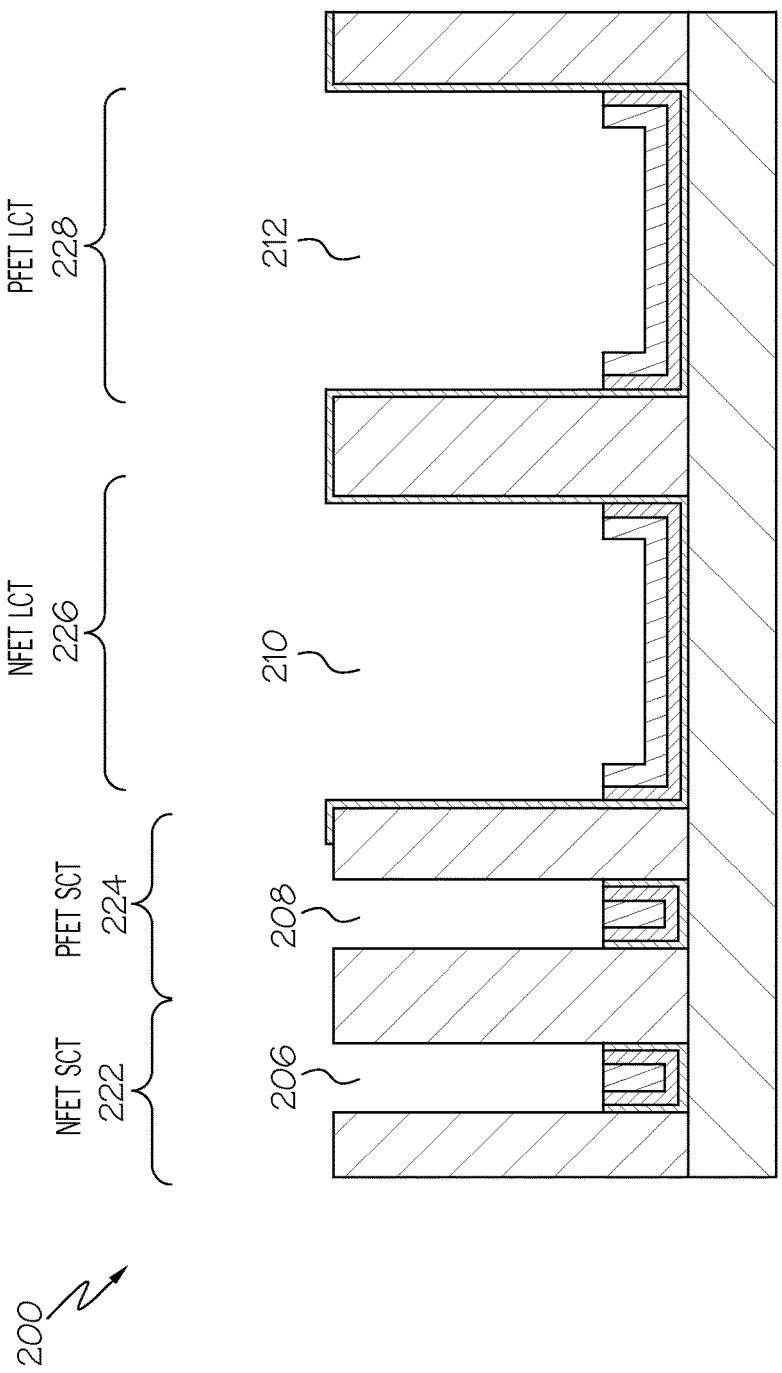

FIG. 2B is a semiconductor structure after a subsequent process step of removing the remaining organic planarization layer.

Figure 2C:
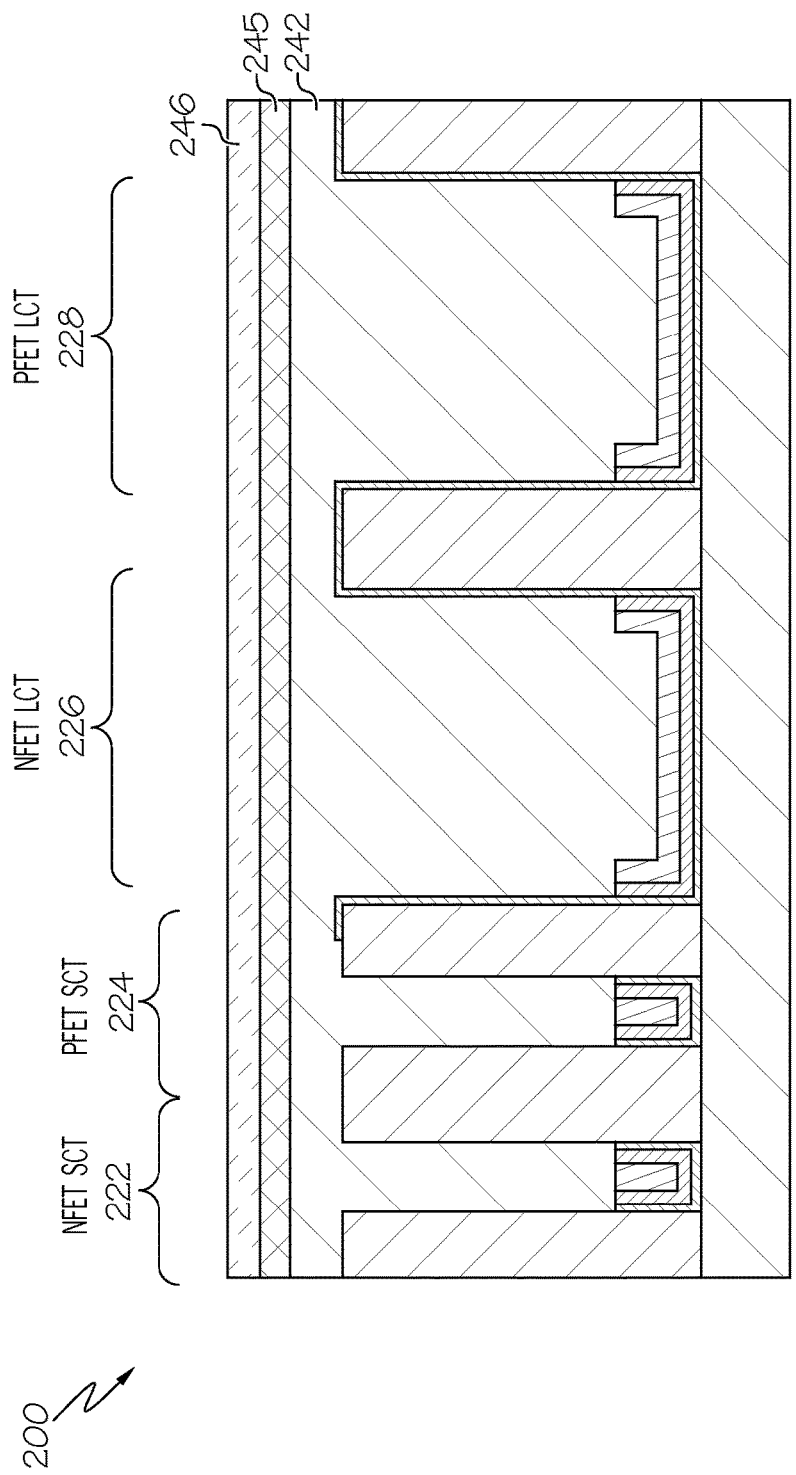

FIG. 2C is a semiconductor structure after a subsequent process step of depositing a lithography stack.

Figure 2D:
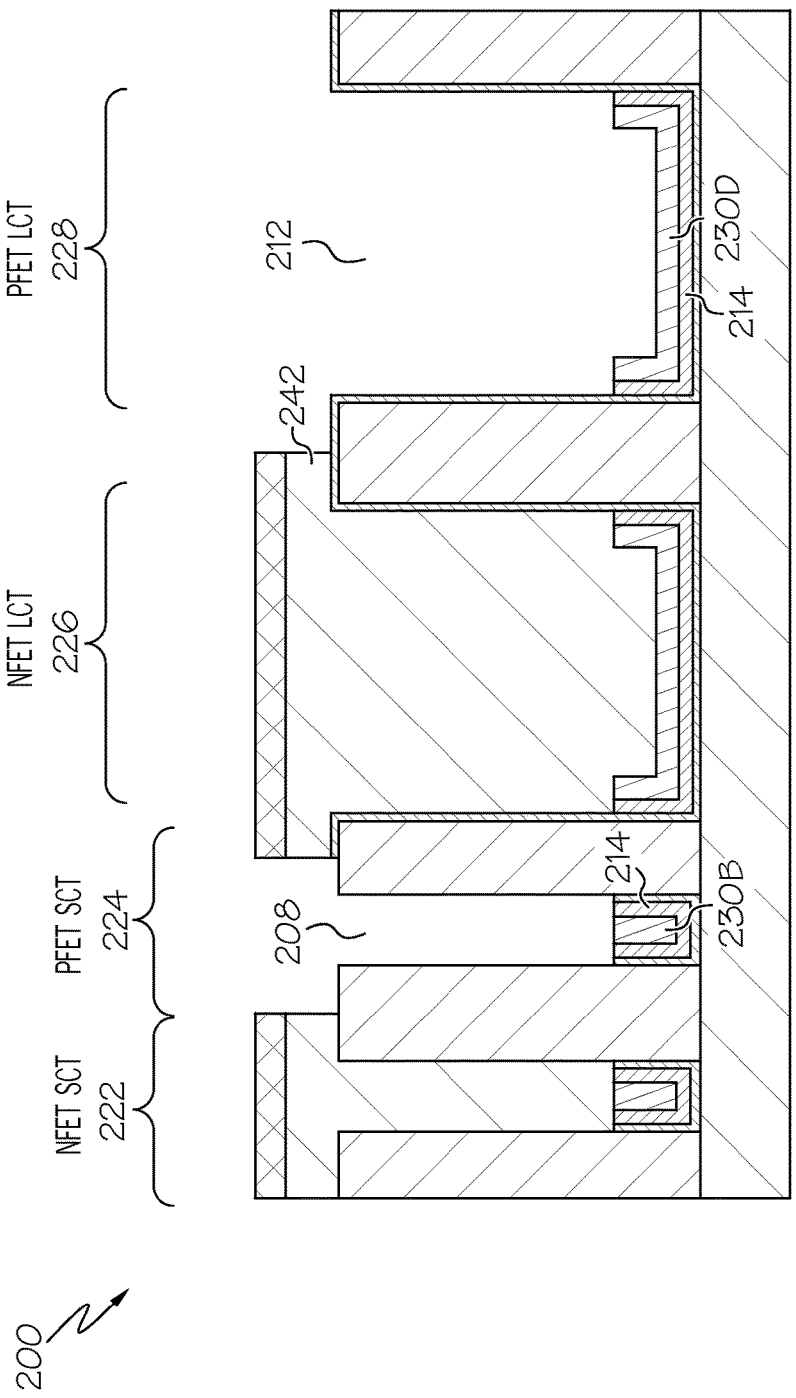

FIG. 2D is a semiconductor structure after a subsequent process step of opening the lithography stack over the PFET trenches.

Figure 2E:
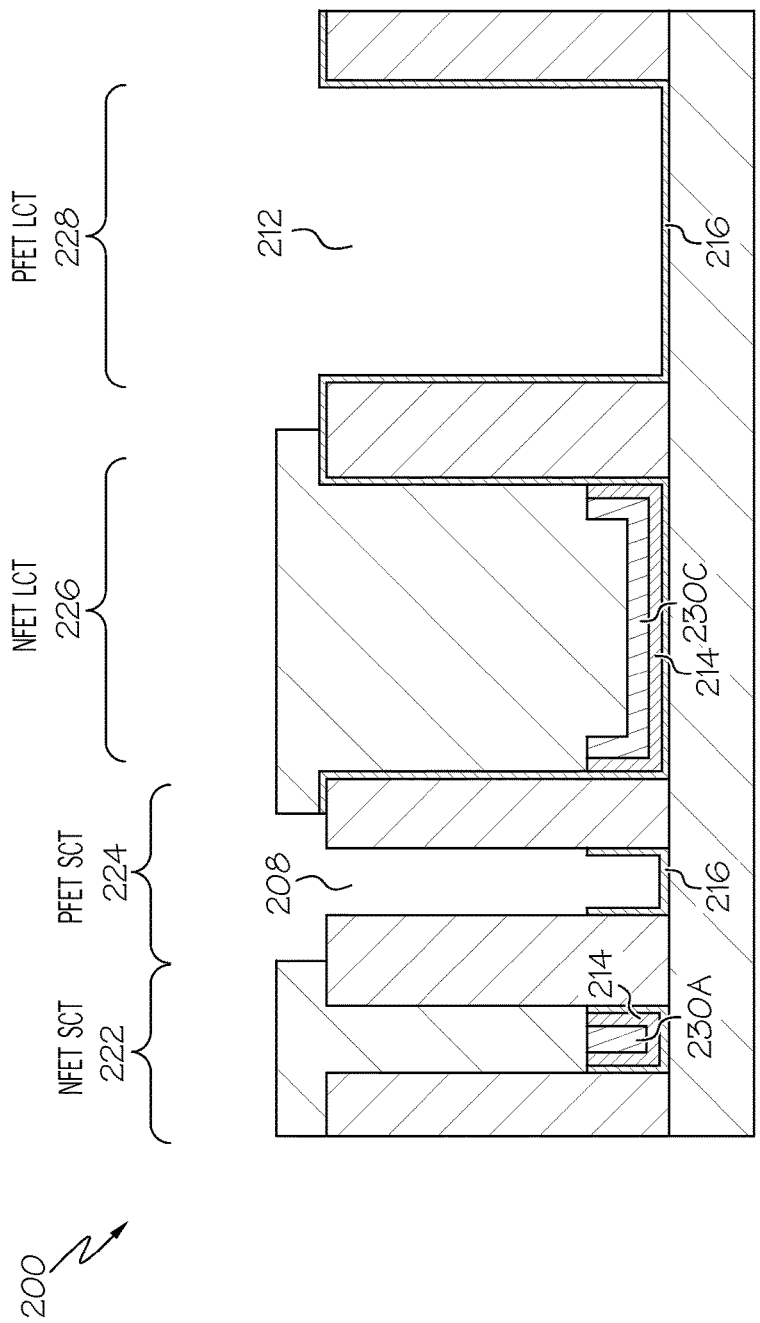

FIG. 2E is a semiconductor structure after a subsequent process step of removing the n-type work function metal in the PFET trenches.

Figure 2F:
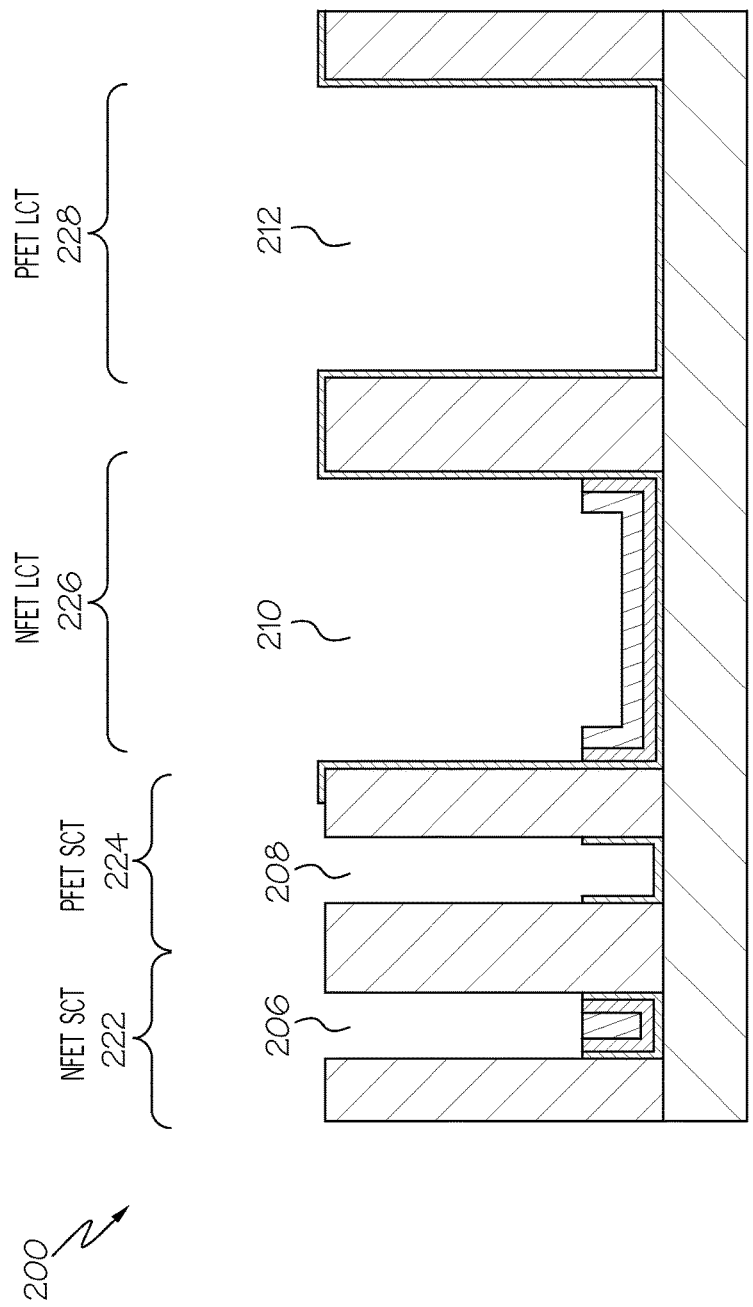

FIG. 2F is a semiconductor structure after a subsequent process step of removing the remaining organic planarization layer.

Figure 2G:
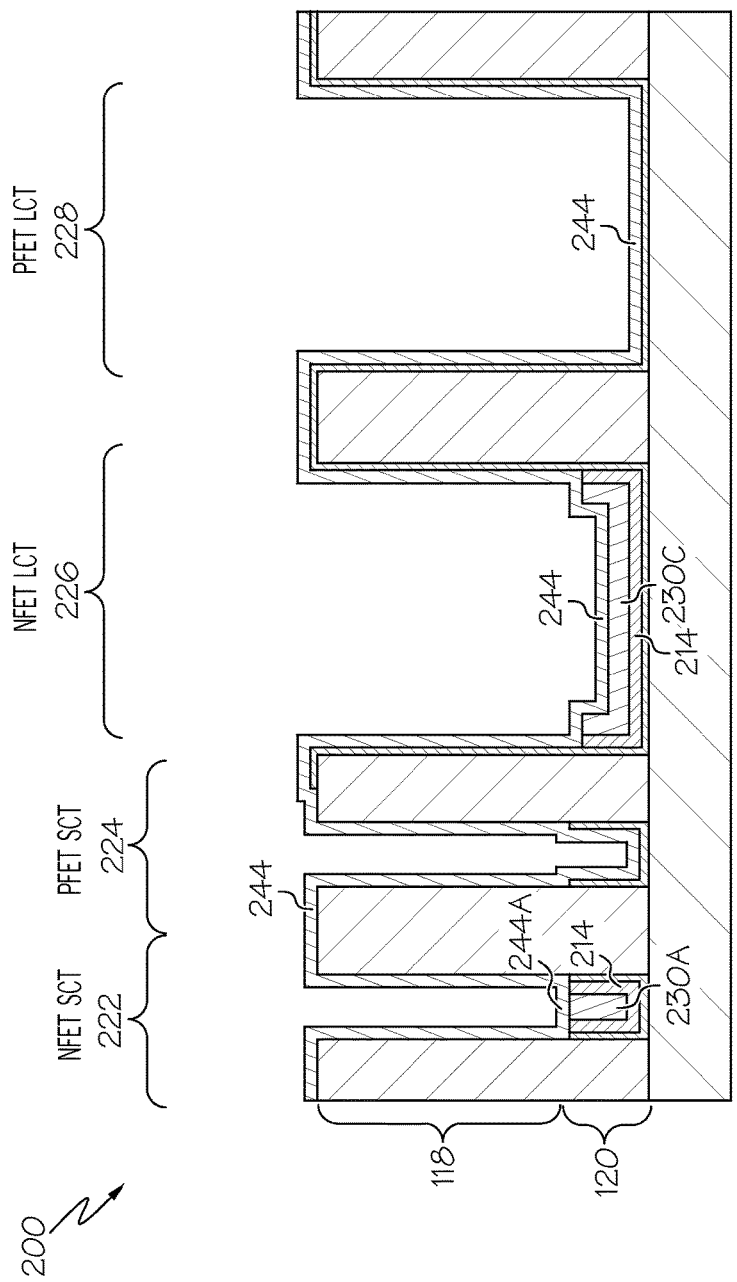

FIG. 2G is a semiconductor structure after a subsequent process step of depositing a p-type work function metal.

Figure 2H:
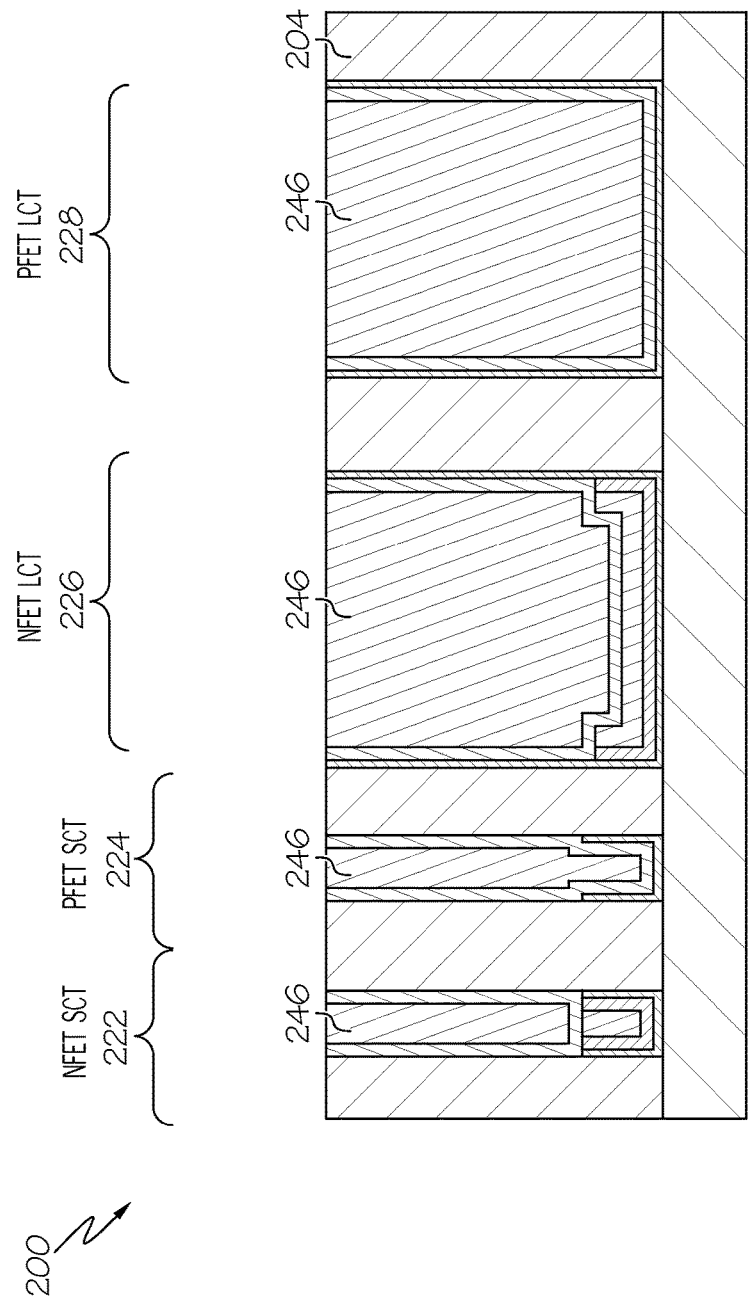

FIG. 2H is a semiconductor structure after a subsequent process step of depositing a gate fill metal.

Figure 2I:
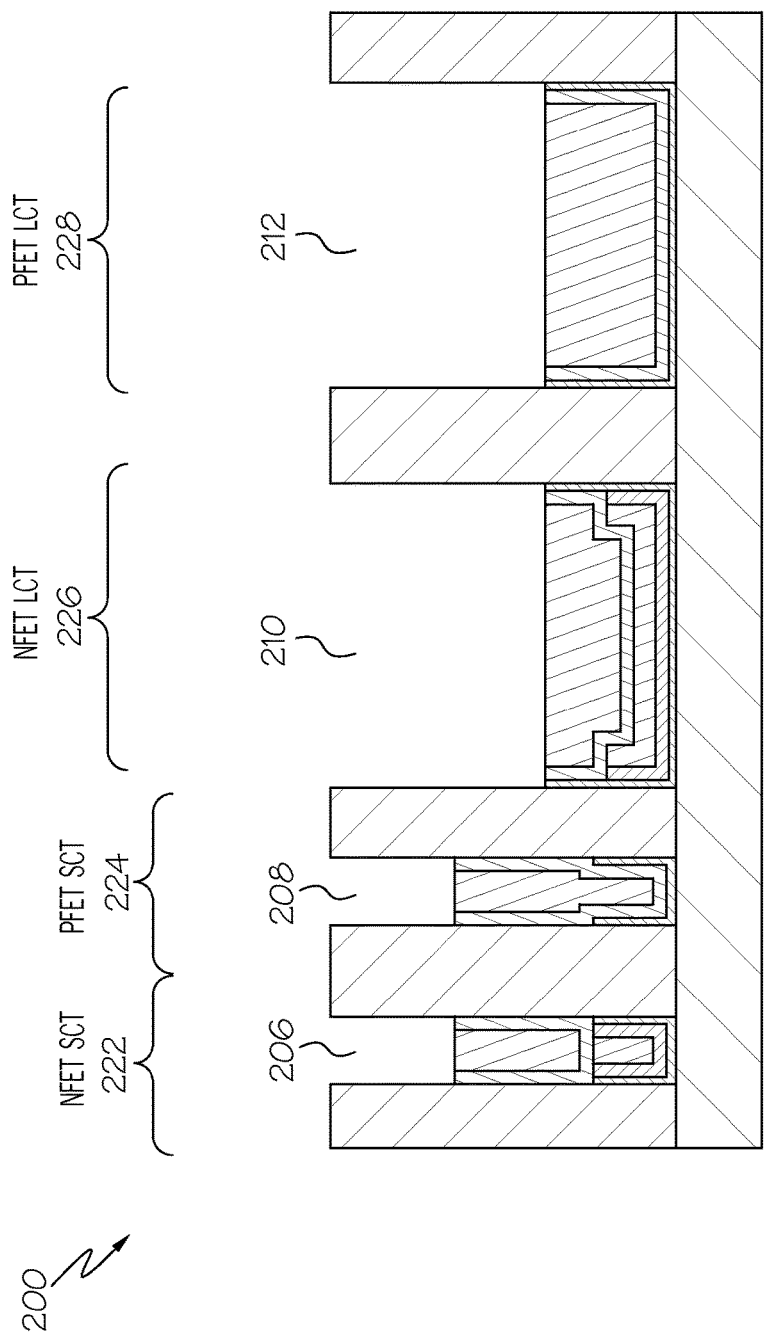

FIG. 2i is a semiconductor structure after a subsequent process step of recessing the gate fill metal.

Figure 2J:
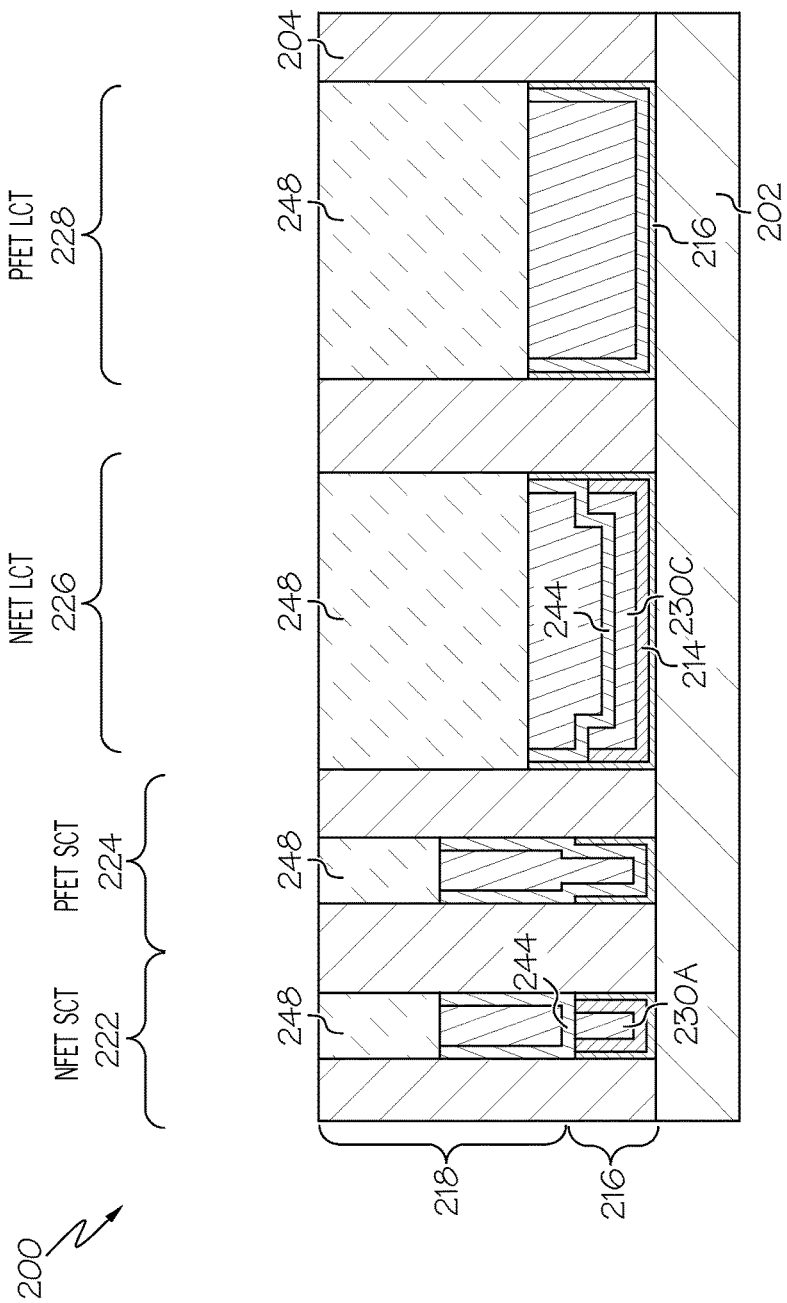

FIG. 2J is a semiconductor structure after a subsequent process step of depositing a capping layer.

Figure 3A:
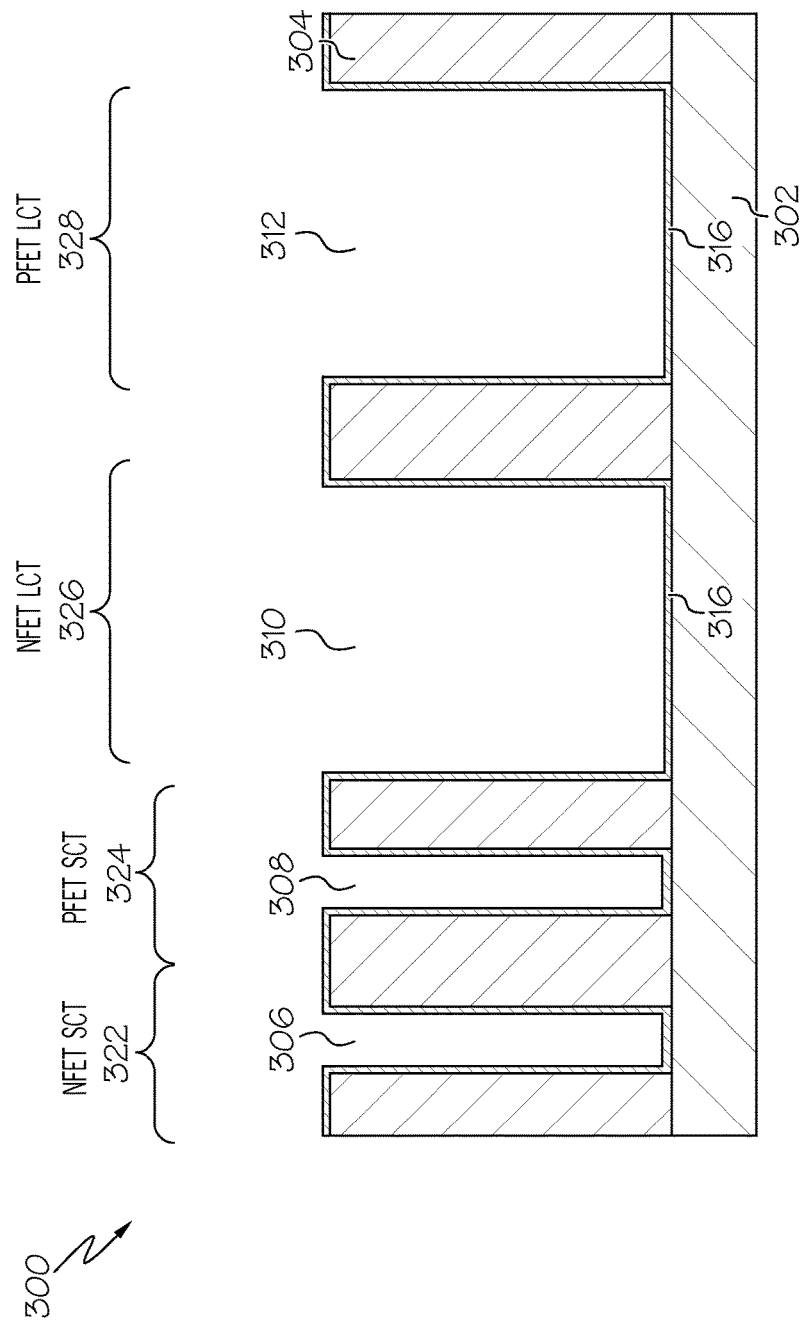

FIG. 3A is a semiconductor structure at a starting point for additional embodiments of the present invention.

Figure 3B:
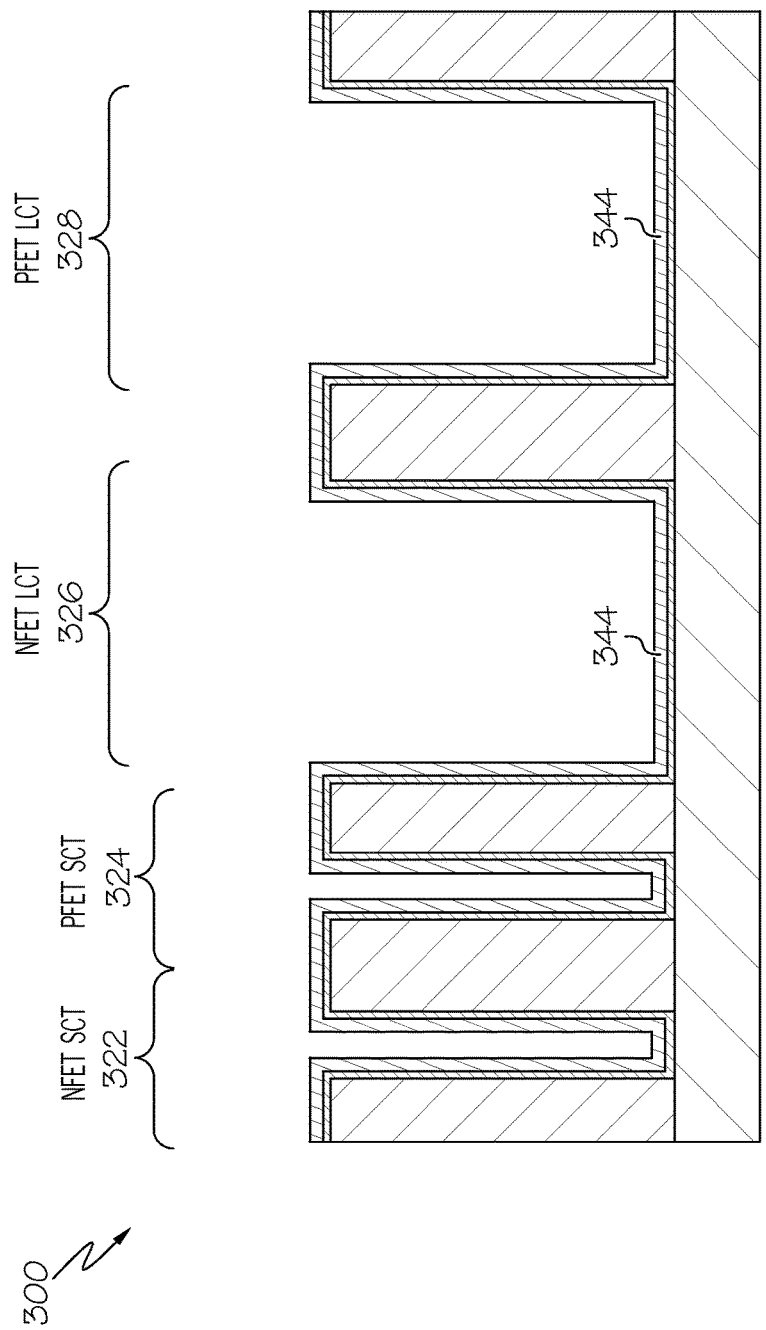

FIG. 3B is a semiconductor structure after a subsequent process step of depositing a titanium nitride layer.

Figure 3C:
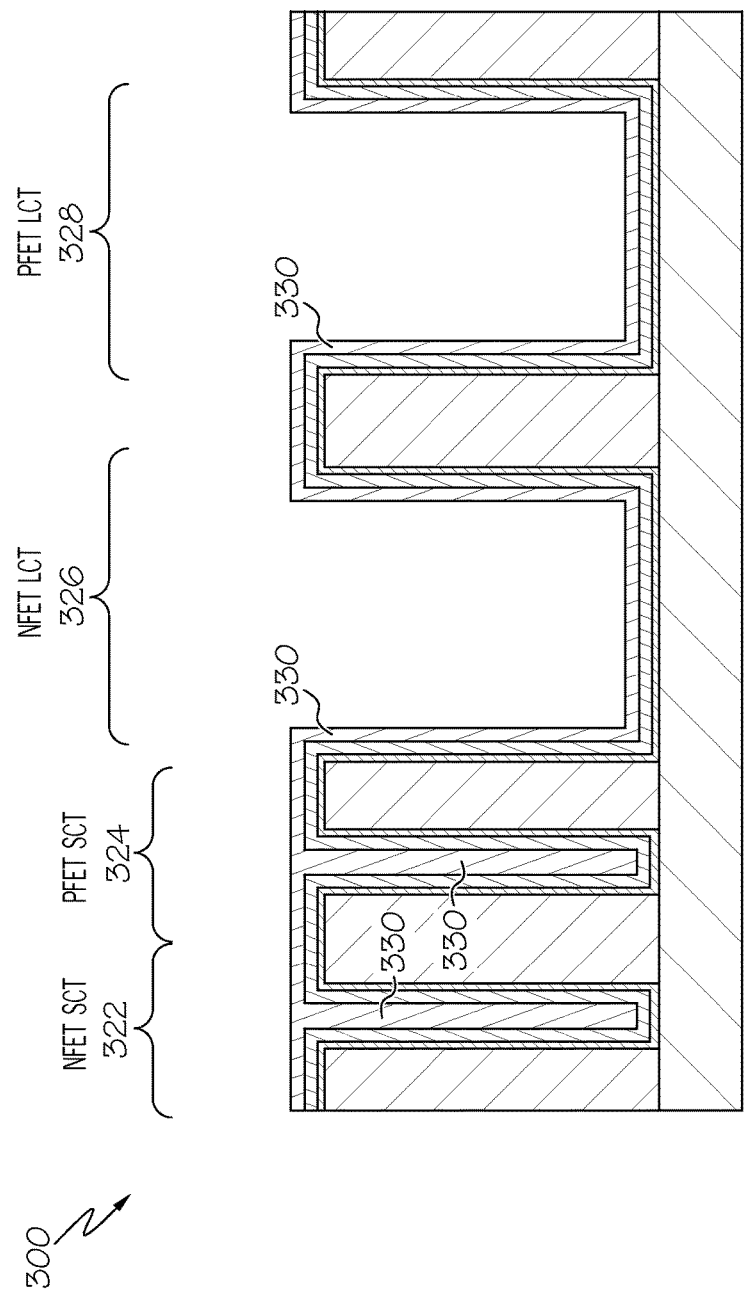

FIG. 3C is a semiconductor structure after a subsequent process step of depositing a metal layer.

Figure 3D:
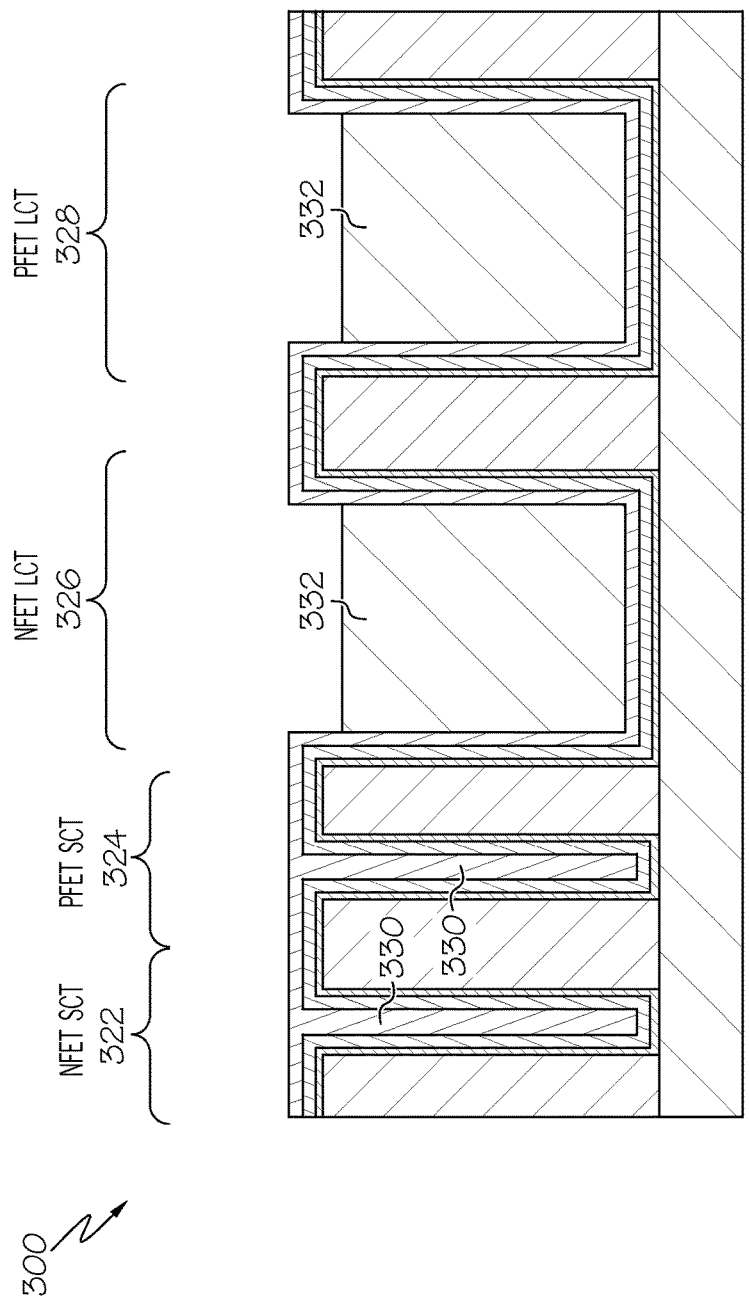

FIG. 3D is a semiconductor structure after a subsequent process step of depositing an organic planarization layer.

Figure 3E:
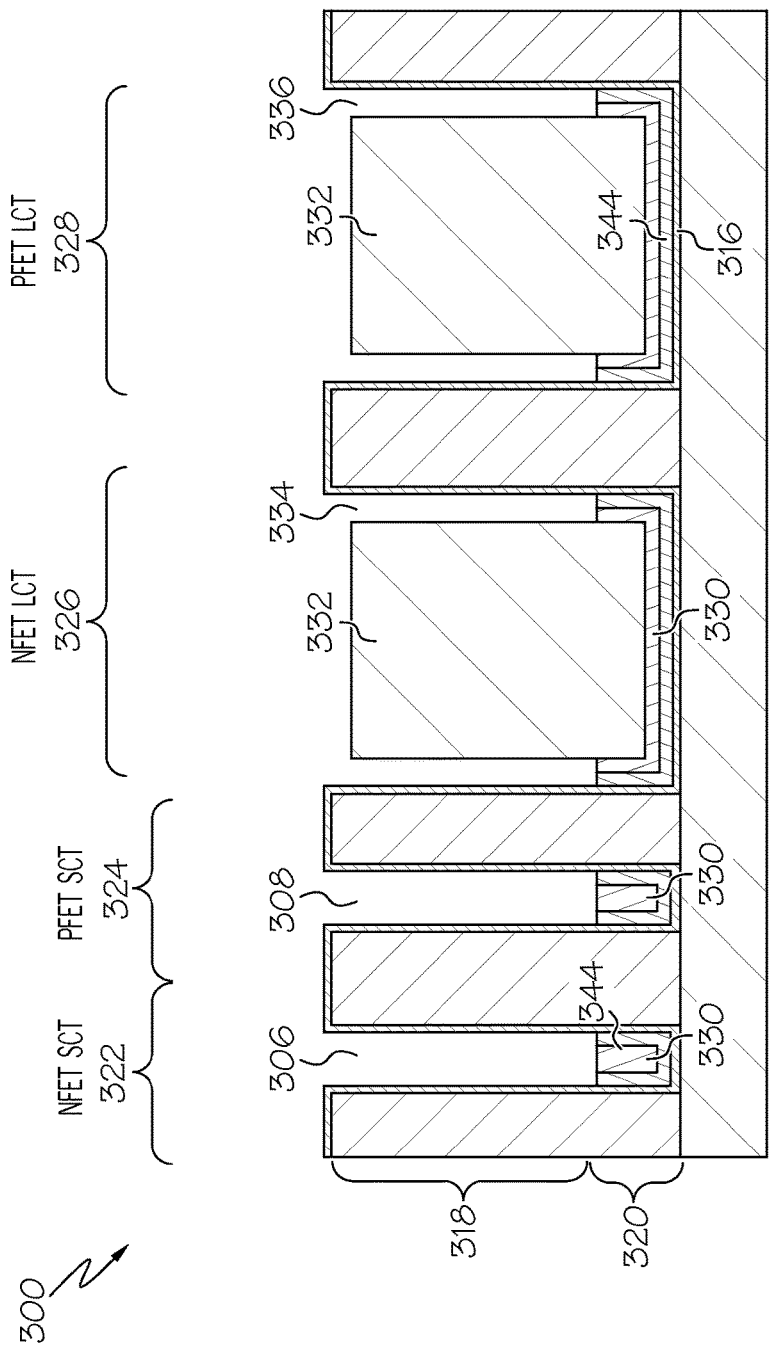

FIG. 3E is a semiconductor structure after a subsequent process step of recessing the metal layer and titanium nitride layer.

Figure 3F:
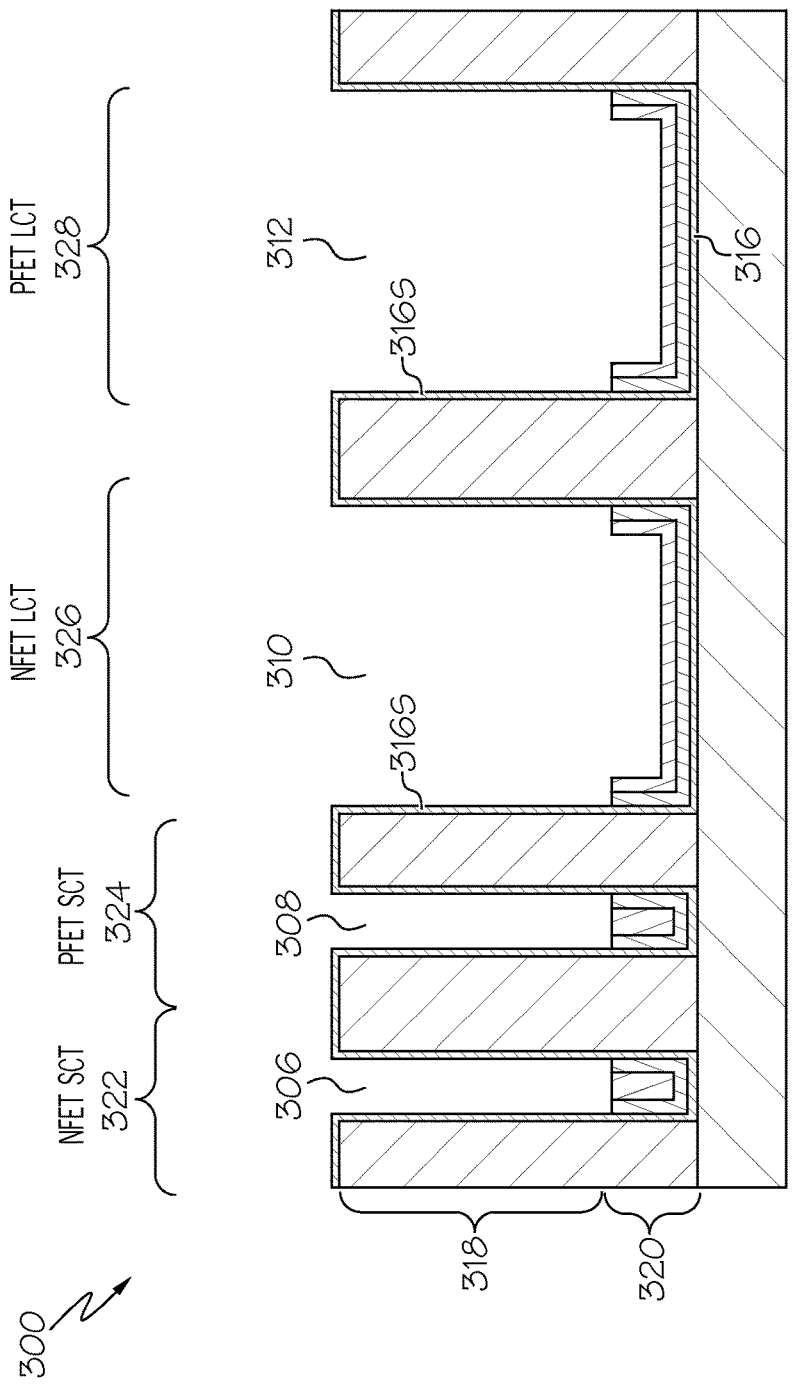

FIG. 3F is a semiconductor structure after a subsequent process step of removing the remaining organic planarization layer.

FIG. 3G is a semiconductor structure after a subsequent process step of recessing the high-K dielectric layer.

Figure 3H:
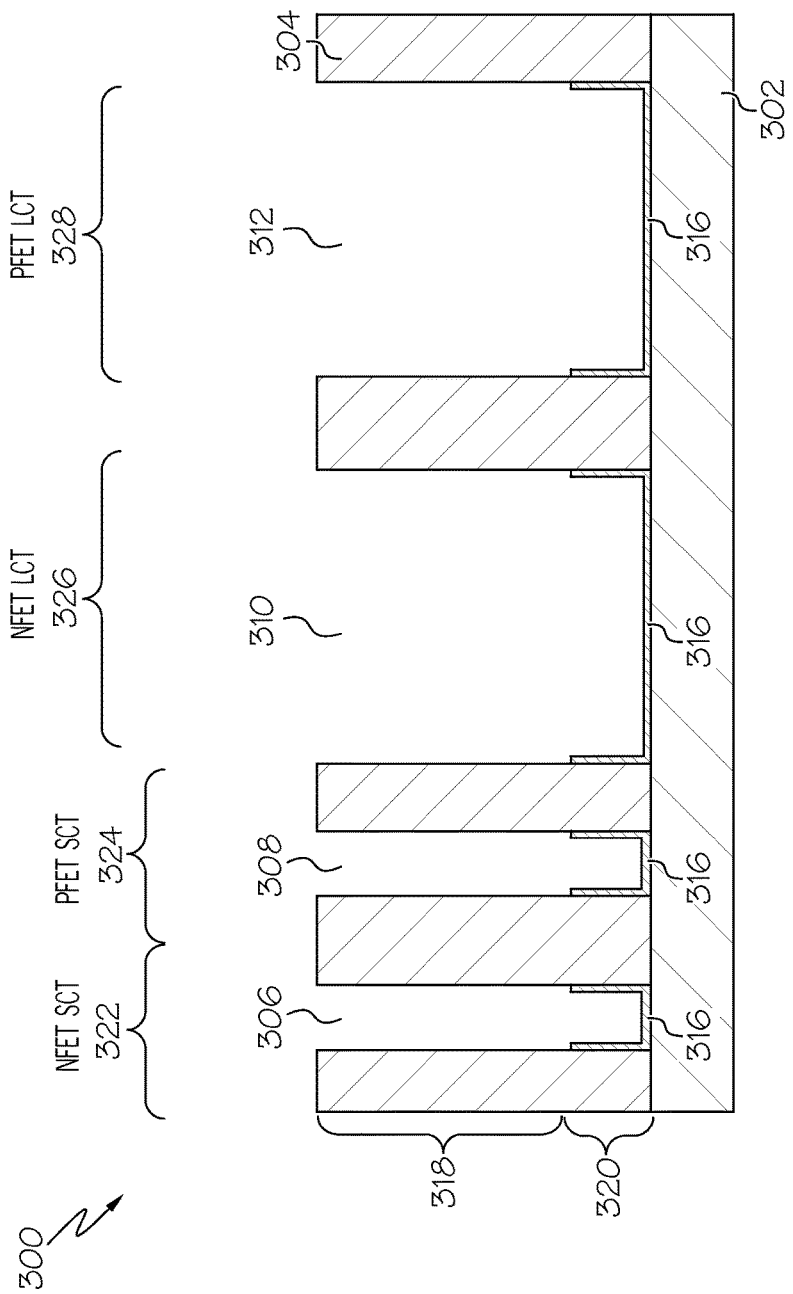

FIG. 3H is a semiconductor structure after a subsequent process step of removing the remaining metal layer and titanium nitride layer.

Figure 4A:
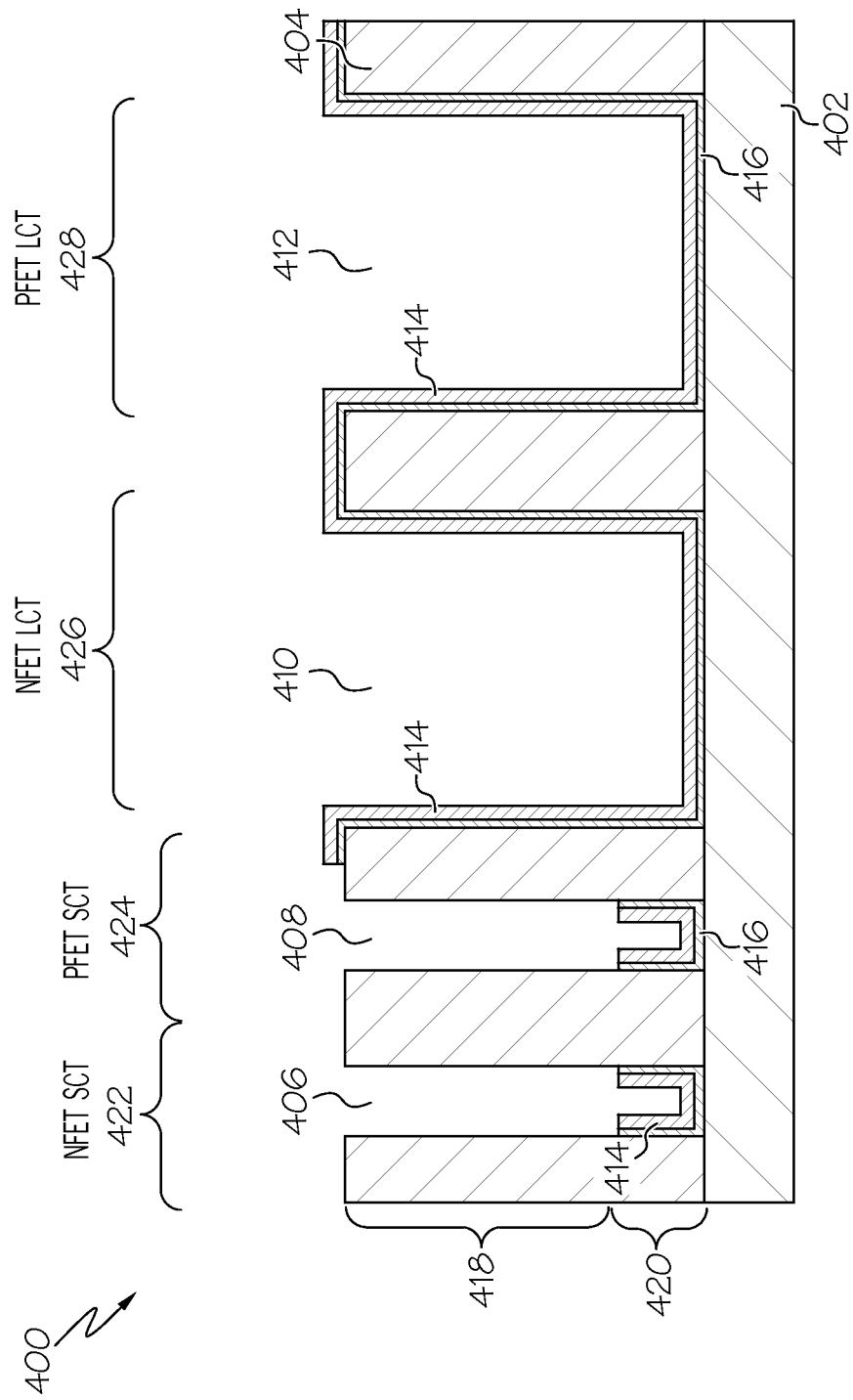

FIG. 4A is a semiconductor structure at a starting point for additional embodiments of the present invention.

Figure 4B:
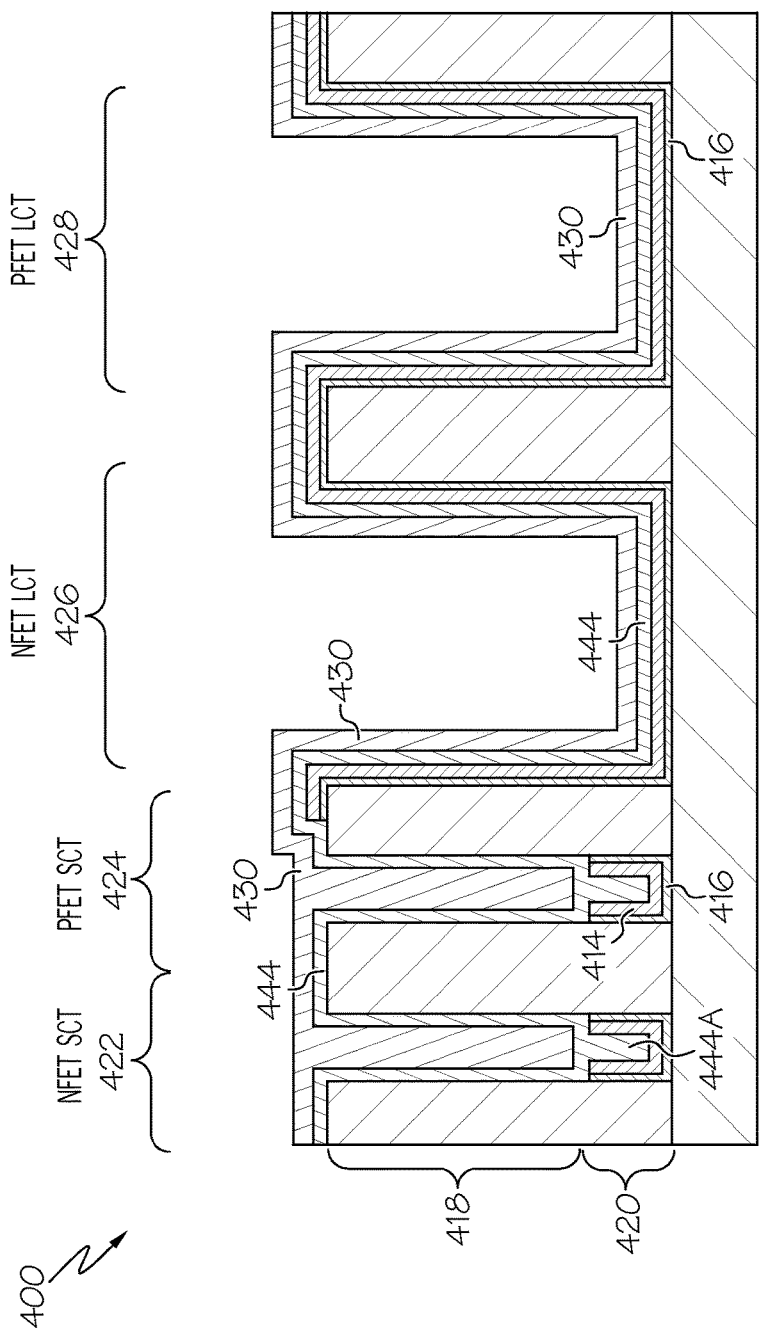

FIG. 4B is a semiconductor structure after a subsequent process step of depositing a titanium nitride layer and metal layer.

Figure 4C:
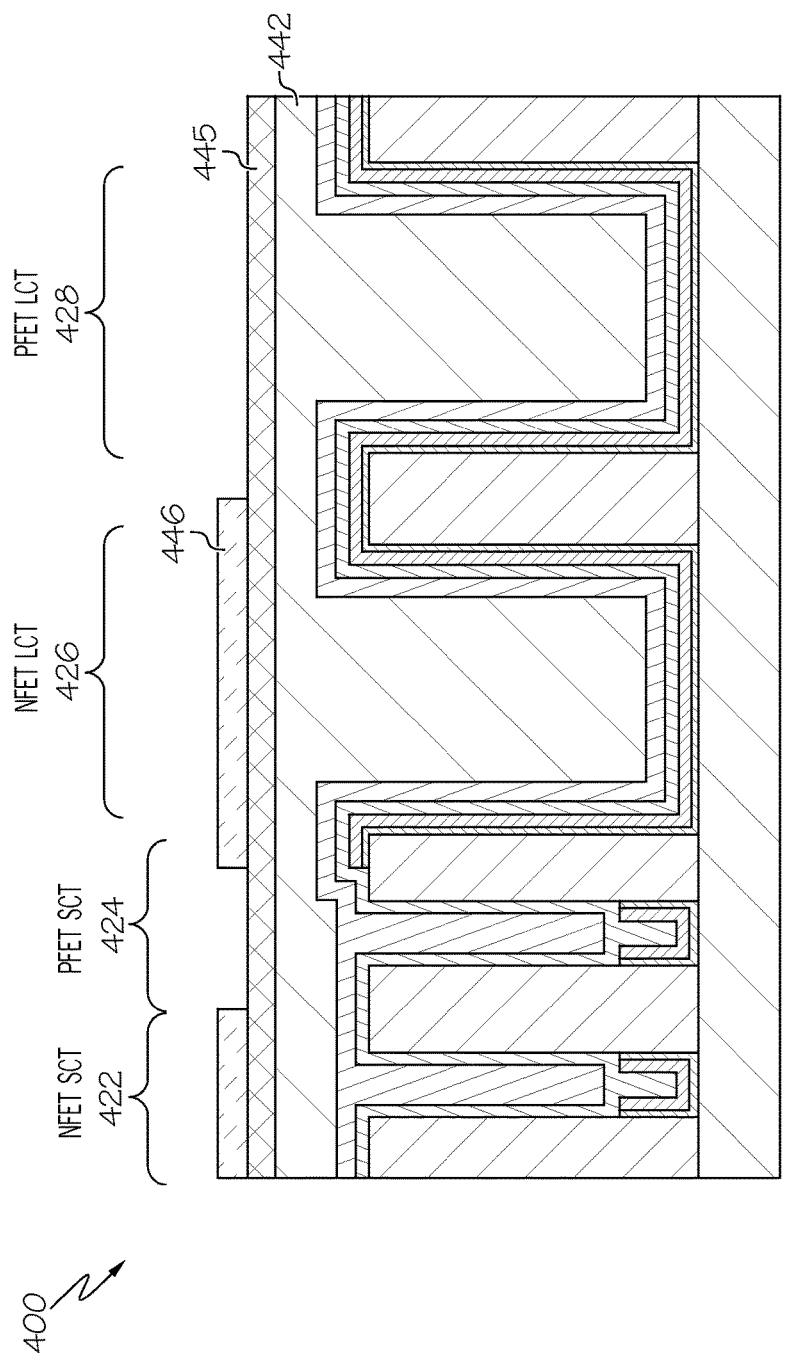

FIG. 4C is a semiconductor structure after a subsequent process step of depositing a lithography stack.

Figure 4D:
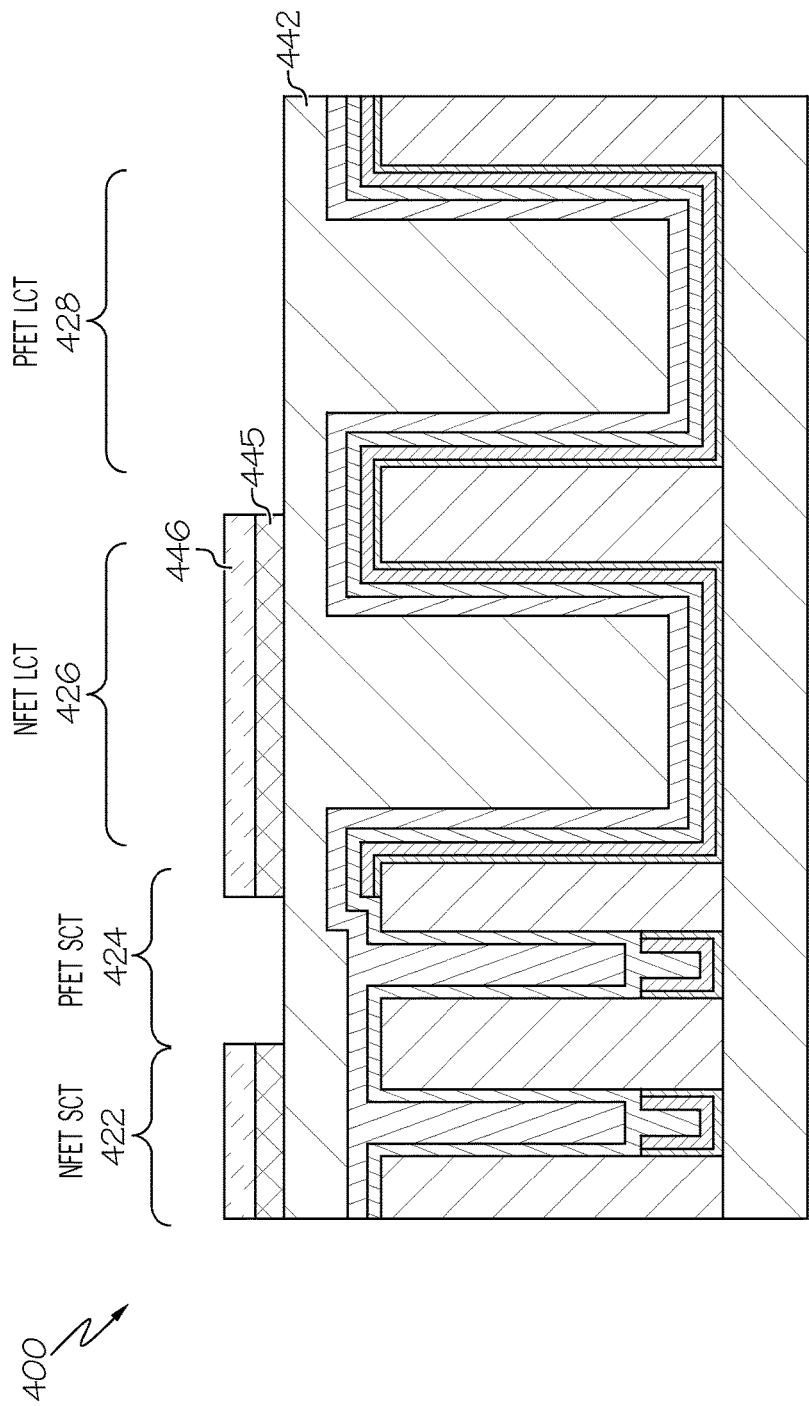

FIG. 4D is a semiconductor structure after a subsequent process step of opening the lithography stack over the PFET trenches.

Figure 4E:
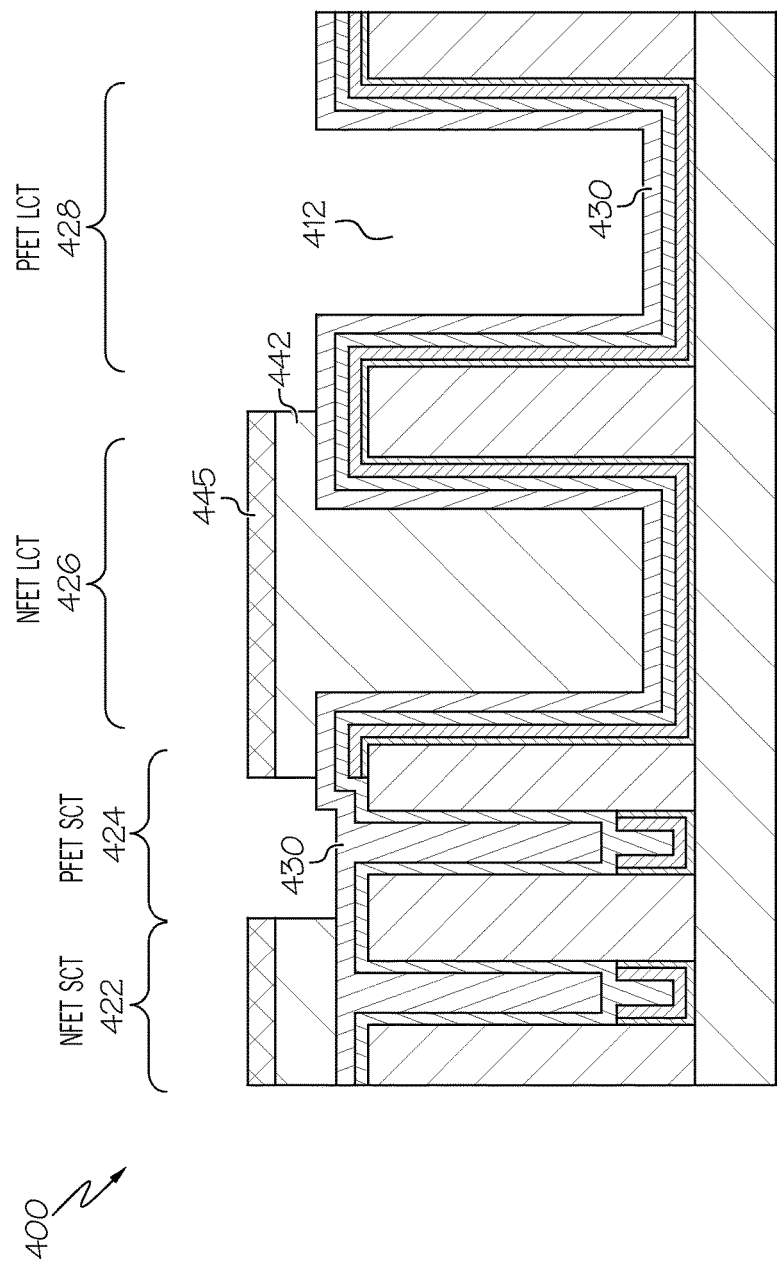

FIG. 4E is a semiconductor structure after a subsequent process step of removing the organic planarization layer in the PFET trenches.

Figure 4F:
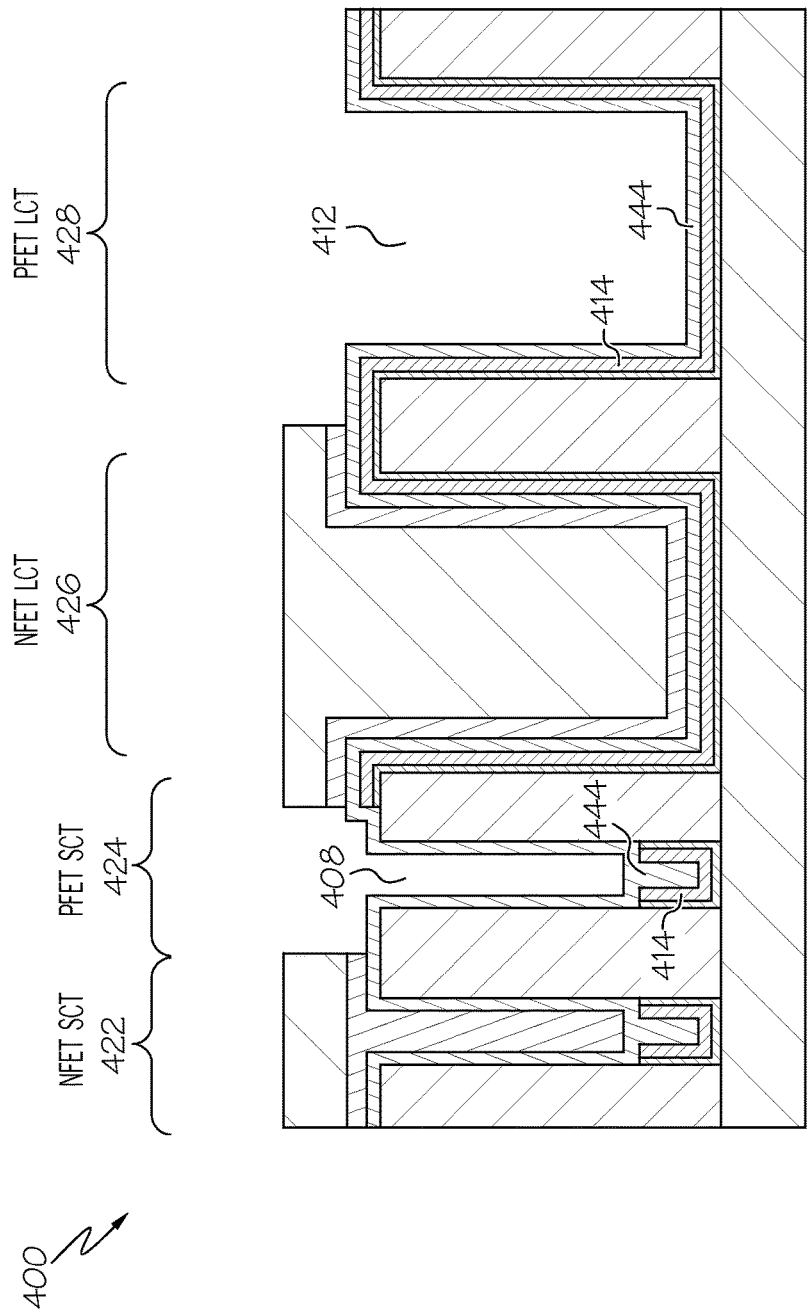

FIG. 4F is a semiconductor structure after a subsequent process step of removing the metal layer in the PFET trenches.

Figure 4G:
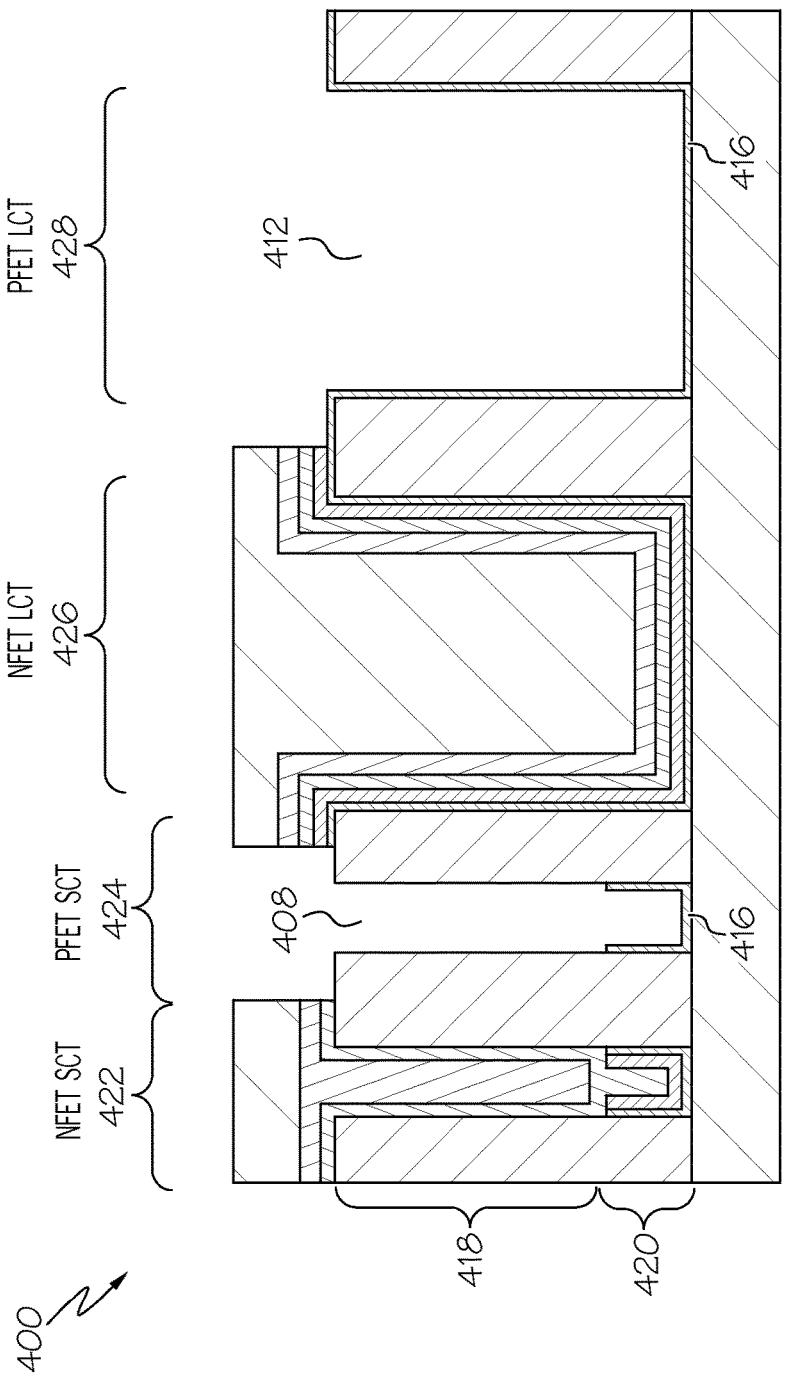

FIG. 4G is a semiconductor structure after a subsequent process step of removing the n-type work function metal in the PFET trenches.

Figure 4H:
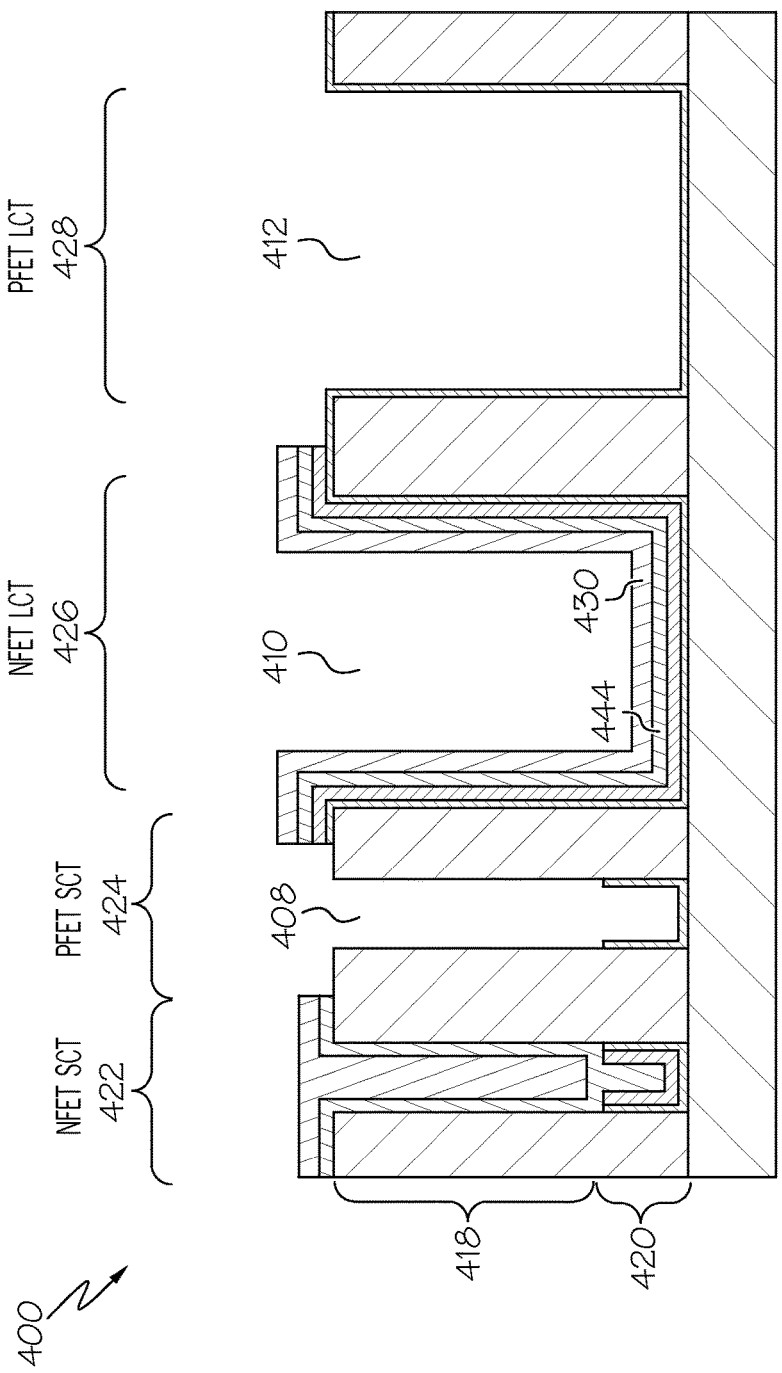

FIG. 4H is a semiconductor structure after a subsequent process step of removing the remaining organic planarization layer.

Figure 4I:
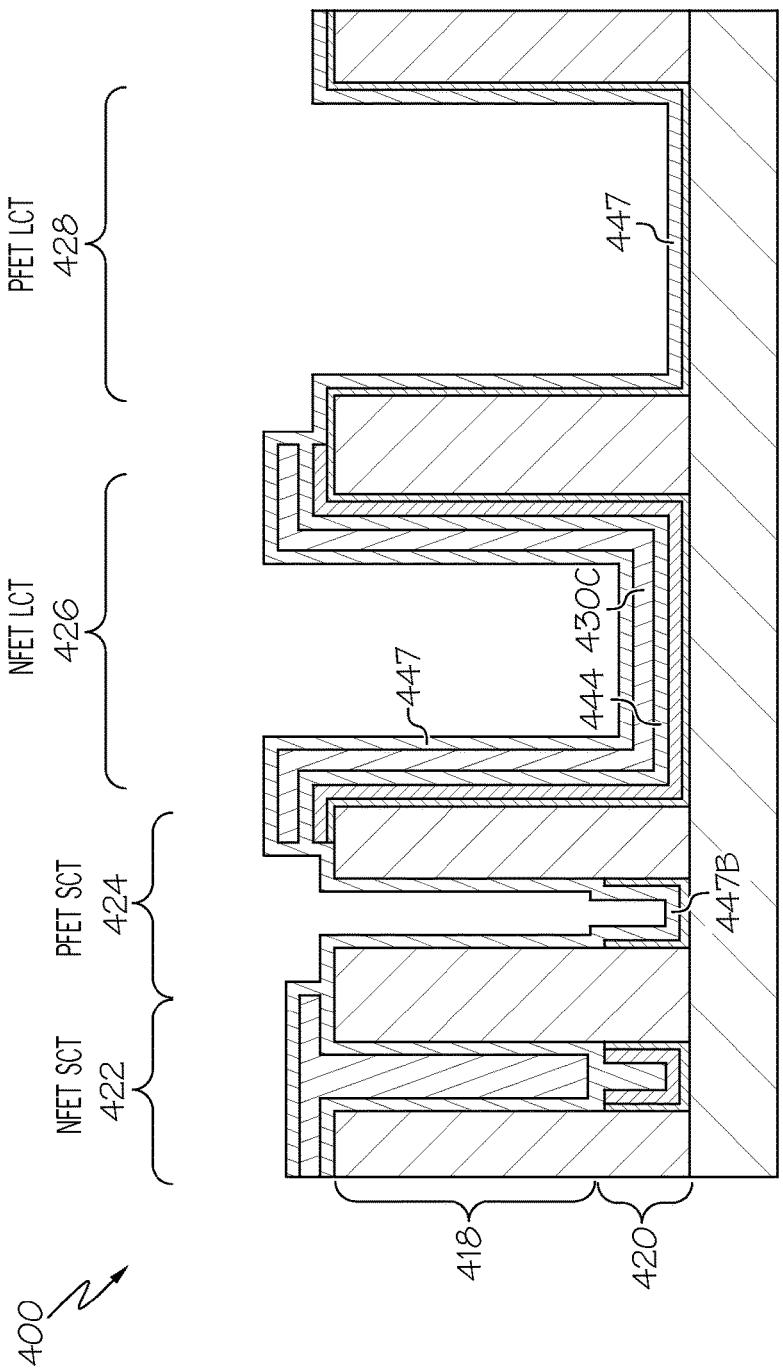

FIG. 4i is a semiconductor structure after a subsequent process step of depositing a p-type work function metal.

Figure 4J:
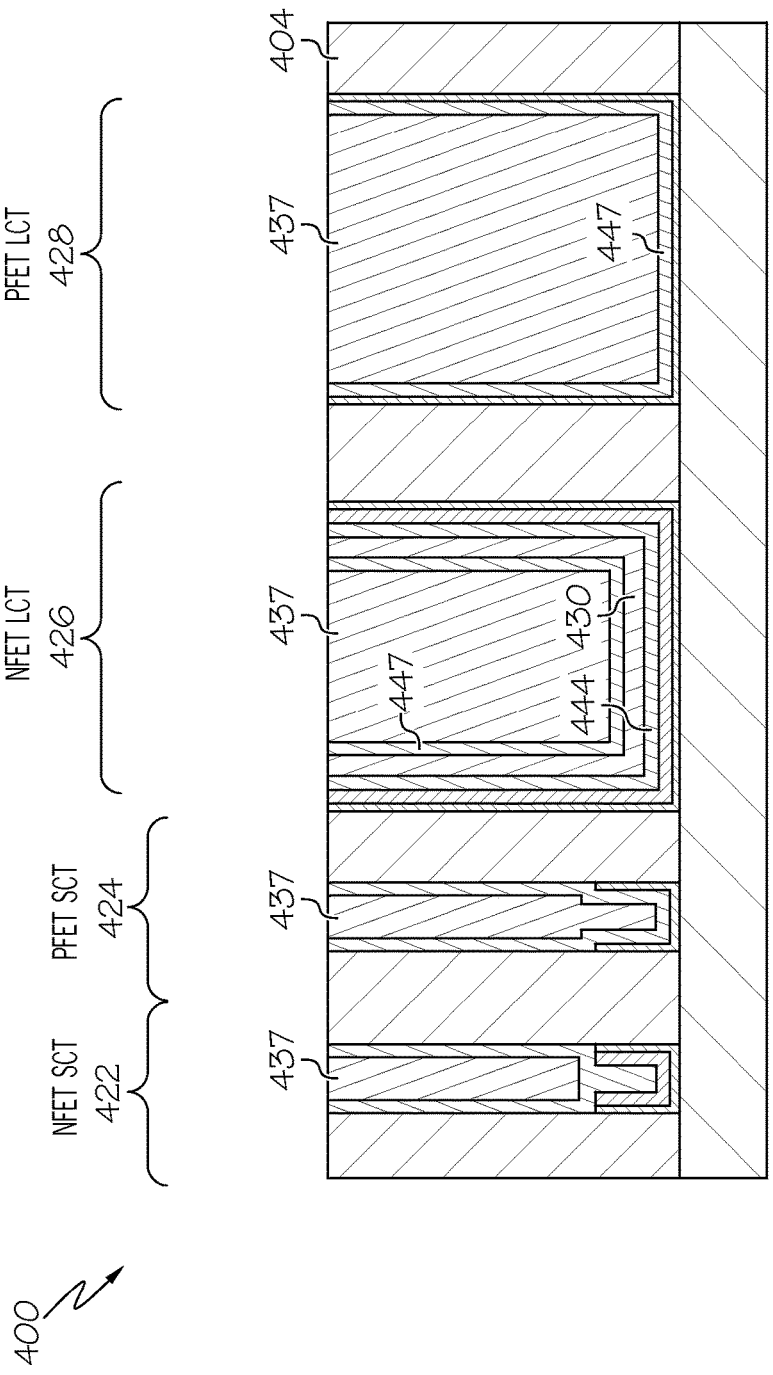

FIG. 4J is a semiconductor structure after a subsequent process step of depositing a gate fill metal.

Figure 4K:
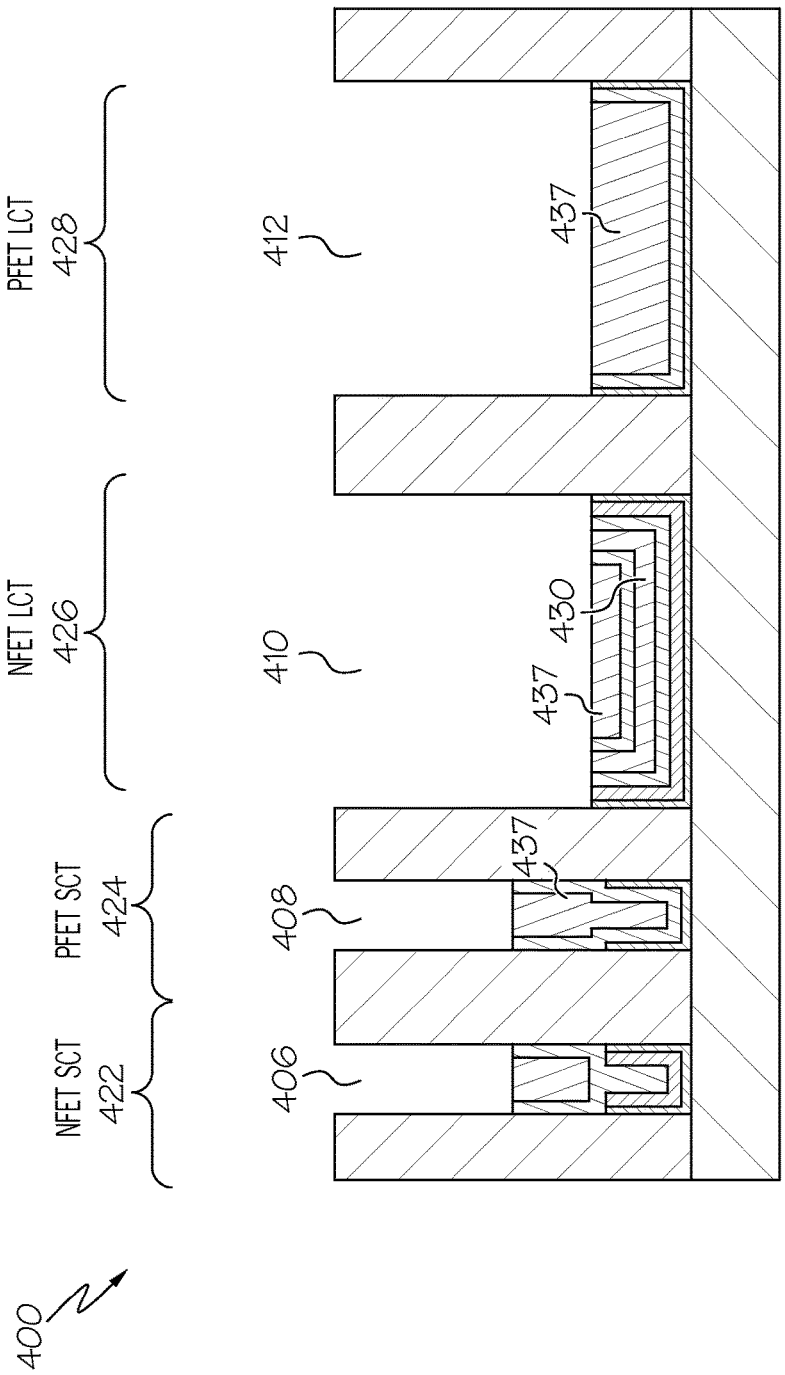

FIG. 4K is a semiconductor structure after a subsequent process step of recessing the gate fill metal.

Figure 4L:
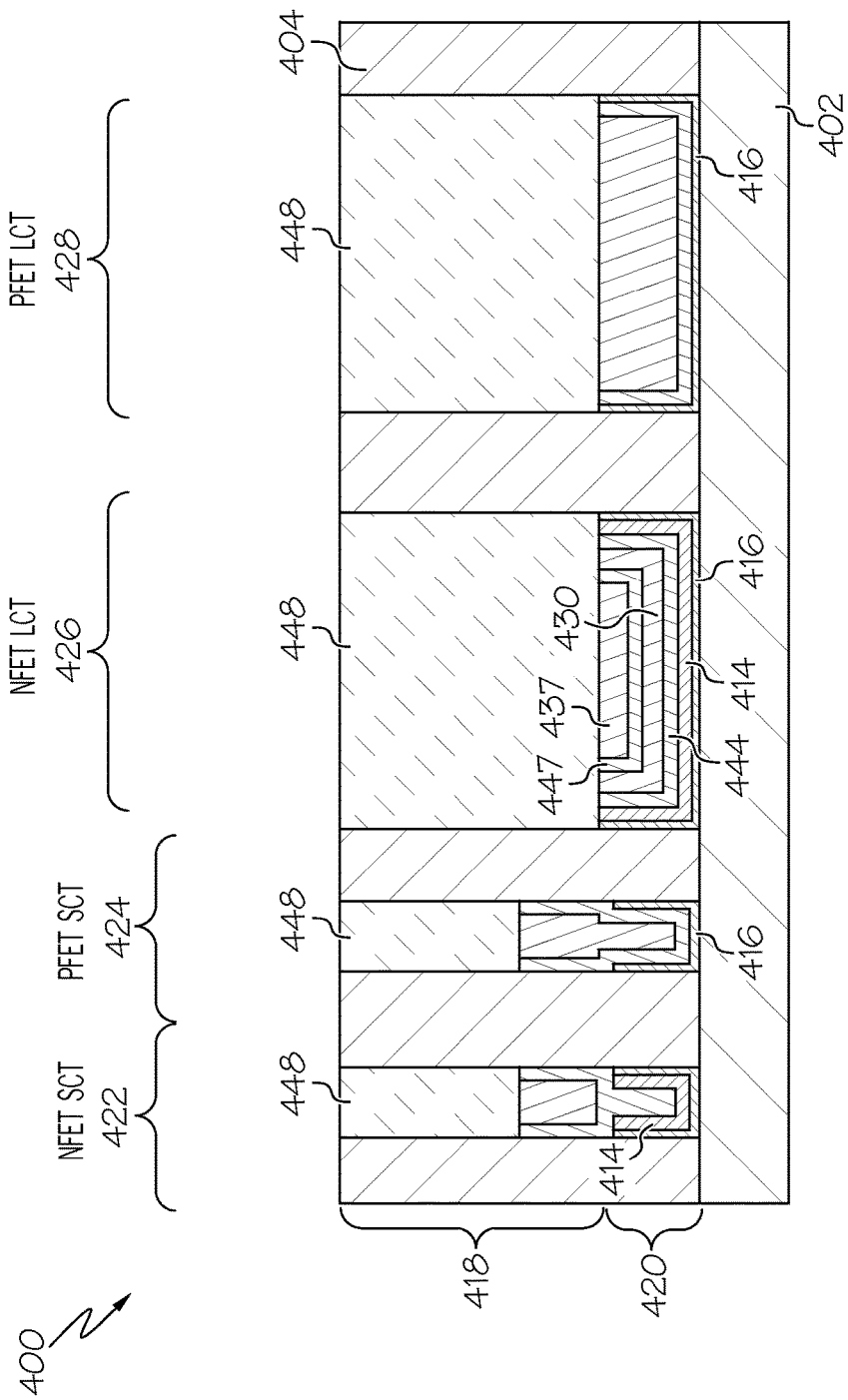

FIG. 4L is a semiconductor structure after a subsequent process step of depositing a capping layer.

Figure 5:
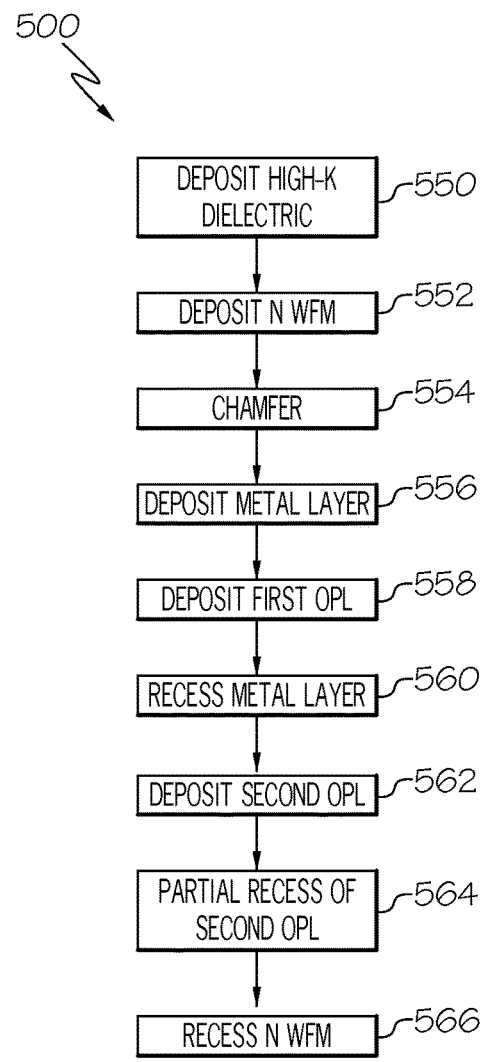

FIG. 5 is a flowchart for embodiments of the present invention.

Figure 6:
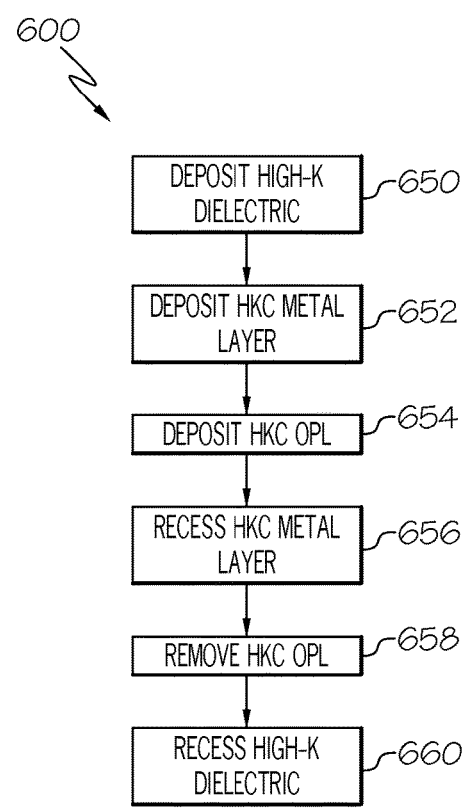

FIG. 6 is a flowchart for additional embodiments of the present invention.

DETAILED DESCRIPTION

Exemplary embodiments will now be described more fully herein with reference to the accompanying drawings, in which exemplary embodiments are shown. It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art.

The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

As used herein, "depositing" may include any now known or later developed techniques appropriate for the material to be deposited including, but not limited to, for example: chemical vapor deposition (CVD), low-pressure CVD (LP-CVD), plasma-enhanced CVD (PECVD), sub-atmospheric CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

FIG. 1A is a semiconductor structure 100 at a starting point for embodiments of the present invention. Semiconductor structure 100 comprises semiconductor substrate 102. In embodiments, semiconductor substrate 102 comprises a silicon substrate. Substrate 102 may be a bulk silicon substrate or a semiconductor-on-insulator (SOI) semiconductor substrate. A dielectric layer 104 is formed on the semiconductor substrate 102. In embodiments, the dielectric layer 104 is comprised of silicon oxide. A plurality of trenches are formed in the dielectric layer 104, which include an n-type field effect transistor (nFET) short channel trench (SCT) 122, p-type field effect transistor (pFET) SCT 124, nFET long channel trench (LCT) 126, and/or a pFET LCT 128. The short channel trenches 122 and 124 have a width W1, which may or may not be uniform among all of the short channel trenches 122, 124. In embodiments, W1 ranges from about 20 nanometers to about 40 nanometers. The long channel trenches 126 and 128 have a width W2, which also may or may not be uniform among all of the long channel trenches 126, 128. In embodiments, W2 ranges from about 45 nanometers to about 500 nanometers. A corresponding cavity is present for each trench. Trench 122 has cavity 106, trench 124 has cavity 108, trench 126 has cavity 110, and trench 128 has cavity 112. A layer of high-K dielectric 116 lines the trench 126 and 128. The high-K dielectric 116 is also in a lower, chamfered region 120 of trench 122 and trench 124, while the high-K dielectric is not present in an upper, non-chamfered region 118 of the trench 122 and trench 124. An n-type work function material (nWFM) 114 is disposed on the high-K dielectric layer 116 and non-chamfered region 118 of the trench 122 and trench 124. In embodiments, the high-K dielectric layer is comprised of hafnium oxide. In other embodiments, the high-K dielectric layer is comprised of zirconium oxide. In embodiments, the nWFM 114 may be comprised of titanium nitride. In some embodiments, the nWFM 114 may be comprised of a multi-layer stack (not shown) of a first layer of titanium nitride, a layer of titanium carbide, and a second layer of titanium nitride.

FIG. 1B is a semiconductor structure 100 after a subsequent process step of depositing a metal layer 130. In embodiments, metal layer 130 is comprised of tungsten. The metal layer 130 deposits conformally on the long channel trenches 126 and 128. However, since the short channel trenches 122 and 124 are much narrower than the long channel trenches and have a much higher aspect ratio, the deposition of metal layer 130 fills the trenches 122 and 124.

FIG. 1C is a semiconductor structure 100 after a subsequent process step of depositing an organic planarization layer (OPL) 132. In embodiments, the OPL 132 may include a photo-sensitive organic polymer comprising a light-sensitive material that, when exposed to electromagnetic radiation, is chemically altered and thus configured to be removed using a developing solvent. For example, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB).

FIG. 1D is a semiconductor structure 100 after a subsequent process step of recessing the organic planarization layer material 132 to a distance W3 below the top of metal layer 130. In embodiments, W3 ranges from about 10 nanometers to about 20 nanometers.

FIG. 1E is a semiconductor structure 100 after a subsequent process step of recessing the metal layer 130. In embodiments, the recess of metal layer 130 may be performed by a fluorine-based wet etch process. As a result of the recess, metal region 130A remains in the chamfered region 120 of trench 122, metal region 130B remains in the chamfered region 120 of trench 124, metal region 130C remains in the lower regions of trench 126, and metal region 130D remains in the lower regions of trench 128. A narrow trench 134 and 136 are formed on the sides of the long channel trenches 126 and 128 between the OPL 132 and the nWFM 114. The narrow trenches 134 and 136 may have a width of the same order of magnitude as W1 of the short channel trenches 122 and 124.

FIG. 1F is a semiconductor structure 100 after a subsequent process step of depositing additional organic planarization material 132 to fill the narrow trench 134 and 136. In some embodiments, the original organic planarization layer may be completely removed, and a new organic planarization layer may be deposited, to reduce the chance of voids forming in the narrow trench regions.

FIG. 1G is a semiconductor structure 100 after a subsequent process step of performing a partial recess of the organic planarization layer. As a result of the partial recess, OPL region 132A remains in the chamfered region 120 of trench 122, and OPL region 1328 remains in the chamfered region 120 of trench 124, whereas the metal region 130C is exposed in trench 126 and metal region 130D is exposed in trench 128.

FIG. 1H is a semiconductor structure 100 after a subsequent process step of performing a partial recess of the n-type work function metal. In embodiments, the recess may be performed using a chlorine-based wet etch. In the short channel trenches 122 and 124, the OPL regions 132A and 132B provide protection for the nWFM 114, while in the long channel trenches 126 and 128 the metal regions 130C and 130D, respectively, provide the protection for the nWFM 114. In embodiments, the metal regions 130A-130D are comprised of tungsten.

FIG. 1i is a semiconductor structure 100 after a subsequent process step of depositing an additional lithography stack. The lithography stack comprises OPL 142. Disposed on OPL 142 is an anti-reflective coating (ARC) layer 145. In embodiments, layer 145 is a silicon-containing anti-reflective coating (SiARC). In other embodiments, layer 145 is a titanium-containing anti-reflective coating (TiARC). Disposed on the ARC layer 145 is a photoresist layer 146.

FIG. 1J is a semiconductor structure 100 after a subsequent process step of opening the lithography stack over the PFET trenches 124 and 128. This may be accomplished using industry-standard patterning and lithographic techniques.

FIG. 1K is a semiconductor structure 100 after a subsequent process step of removing the lithography stack in the PFET trenches 124 and 128. As a result, cavities 108 and 112 are opened in trenches 124 and 128 respectively. Furthermore, the metal region 130B in chamfered region 120 of trench 124 is exposed, and photoresist layer 146 is removed.

FIG. 1L is a semiconductor structure 100 after a subsequent process step of removing the n-type work function metal in the PFET trenches. As a result, high-K dielectric layer 116B is exposed in trench 124, and high-K dielectric layer 116D is exposed in trench 128, while high-K dielectric layer 116A and 116C remain covered by various layers.

FIG. 1M is a semiconductor structure 100 after a subsequent process step of removing the remaining organic planarization layer. As a result, cavity 106 is opened in trench 122, cavity 108 is opened in trench 124, cavity 110 is opened in trench 126, and cavity 112 is opened in trench 128.

FIG. 1N is a semiconductor structure 100 after a subsequent process step of depositing a p-type work function metal 144. In embodiments, the p-type work function metal (pWFM) is comprised of titanium nitride (TiN). As a result of the pWFM deposition, a pWFM region 144A extends into the chamfered region 120 of trench 122. Additionally, metal region 130C is encapsulated by nWFM 114 and pWFM 144 in trench 126.

FIG. 1o is a semiconductor structure 100 after a subsequent process step of depositing a gate fill metal 146. After depositing the gate fill metal 146, the structure 100 may be planarized to make the gate fill metal 146 flush with the top of dielectric layer 104. In embodiments, the planarization may be performed using a chemical mechanical polish (CMP) process.

FIG. 1P is a semiconductor structure 100 after a subsequent process step of recessing the gate fill metal 146, opening cavities 106, 108, 110, and 112.

FIG. 1Q is a semiconductor structure 100 after a subsequent process step of depositing a capping layer 148. In embodiments, capping layer 148 comprises silicon nitride. The capping layer may be planarized to be flush with the top of dielectric layer 104. In embodiments, the planarization may be performed using a chemical mechanical polish (CMP) process.

FIG. 2A is a semiconductor structure 200 at a starting point for additional embodiments of the present invention, following from FIG. 1D. In this embodiment, the metal regions 230A and 230B fill the chamfered region 220 of short trenches 222 and 224, respectively, while narrow trench 234 and 236 are formed on the sides of the long channel trenches 226 and 228. As stated previously, similar elements may be referred to by similar numbers in various figures (FIGs) of the drawing; in which case, typically the last two significant digits may be the same, the most significant digit being the number of the drawing figure (FIG). For example, substrate 102 of FIG. 1A may be similar to substrate 202 of FIG. 2A.

FIG. 2B is a semiconductor structure 200 after a subsequent process step of removing the remaining organic planarization layer (see 236 of FIG. 2A).

FIG. 2C is a semiconductor structure after a subsequent process step of depositing a lithography stack. The lithography stack comprises OPL 242. Disposed on OPL 242 is an anti-reflective coating (ARC) layer 245. In embodiments, layer 245 is a silicon-containing anti-reflective coating (SiARC). In other embodiments, layer 245 is a titanium-containing anti-reflective coating (TiARC). Disposed on the ARC layer is a photoresist layer 246.

FIG. 2D is a semiconductor structure 200 after a subsequent process step of opening the lithography stack over the PFET trenches 224 and 228. This may be accomplished using industry-standard patterning and lithographic techniques. This is followed by a subsequent process step of removing the lithography stack in the PFET trenches 224 and 228. As a result, cavities 208 and 212 are opened in trenches 224 and 228 respectively.

FIG. 2E is a semiconductor structure 200 after a subsequent process step of removing the nWFM 214 and metal layer 230B and 230D from the PFET trenches 224 and 228, respectively. As a result, high-K dielectric layer 216 is exposed in trench 224 and trench 228.

FIG. 2F is a semiconductor structure 200 after a subsequent process step of removing the remaining organic planarization layer. As a result, cavity 206 is opened in trench 222, cavity 208 is opened in trench 224, cavity 210 is opened in trench 226, and cavity 212 is opened in trench 228

FIG. 2G is a semiconductor structure 200 after a subsequent process step of depositing a p-type work function metal 244. In embodiments, the p-type work function metal (pWFM) is comprised of titanium nitride (TiN). As a result of the pWFM deposition, a pWFM region 244A is deposited at the bottom of the non-chamfered region 218 of trench 222. Additionally, metal region 230C is encapsulated by nWFM 214 and pWFM 244 in trench 226, and metal region 230A is encapsulated by nWFM 214 and pWFM 244A in trench 222.

FIG. 2H is a semiconductor structure 200 after a subsequent process step of depositing a gate fill metal 246. After depositing the gate fill metal 246, the structure 200 may be planarized to make the gate fill metal 246 flush with the top of dielectric layer 204. In embodiments, the planarization may be performed using a chemical mechanical polish (CMP) process.

FIG. 2i is a semiconductor structure 200 after a subsequent process step of recessing the gate fill metal 246, opening cavities 206, 208, 210, and 212.

FIG. 2J is a semiconductor structure 200 after a subsequent process step of depositing a capping layer 248. In embodiments, capping layer 248 comprises silicon nitride. The capping layer may be planarized to be flush with the top of dielectric layer 204. In embodiments, the planarization may be performed using a chemical mechanical polish (CMP) process.

FIG. 3A is a semiconductor structure 300 at a starting point for additional embodiments of the present invention which pertain to the high-K chamfering process. A high-K dielectric layer is deposited on the interior surfaces of trenches 322, 324, 326, and 328. In embodiments, the high-K dielectric layer 316 may comprise hafnium oxide. In other embodiments, the high-K dielectric layer may comprise zirconium oxide. As stated previously, similar elements may be referred to by similar numbers in various figures (FIGs) of the drawing; in which case, typically the last two significant digits may be the same, the most significant digit being the number of the drawing figure (FIG). For example, substrate 102 of FIG. 1A may be similar to substrate 302 of FIG. 3A.

FIG. 3B is a semiconductor structure 300 after a subsequent process step of depositing a titanium nitride layer 344.

FIG. 3C is a semiconductor structure 300 after a subsequent process step of depositing a metal layer 330. In embodiments, metal layer 330 is comprised of tungsten. The metal layer 330 deposits conformally on the long channel trenches 326 and 328. However, since the short channel trenches 322 and 324 are much narrower than the long channel trenches and have a much higher aspect ratio, the deposition of metal layer 330 fills the trenches 322 and 324.

FIG. 3D is a semiconductor structure 300 after a subsequent process step of depositing an organic planarization layer (OPL) 332, and performing a recess, such that the OPL 332 is below the top of metal layer 330.

FIG. 3E is a semiconductor structure 300 after a subsequent process step of recessing the metal layer 330 and titanium nitride layer 344. As a result, titanium nitride 344 and metal layer 330 remain in a lower region 320 of short trenches 322 and 324, and long trenches 326 and 328.

FIG. 3F is a semiconductor structure 300 after a subsequent process step of removing the remaining organic planarization layer. As a result, cavity 306 is opened in trench 322, cavity 308 is opened in trench 324, cavity 310 is opened in trench 326, and cavity 312 is opened in trench 328. High-K dielectric regions 316S cover the sidewalls of the long trenches 326 and 328.

FIG. 3G is a semiconductor structure 300 after a subsequent process step of recessing the high-K dielectric layer 316. As a result, the high-K dielectric 316 is removed from the upper region 318 of the trenches 322, 324, 326, and 328, while the high-K dielectric 316 remains in the lower region 320 of the trenches 322, 324, 326, and 328. Thus, the trenches are now chamfered.

FIG. 3H is a semiconductor structure 300 after a subsequent process step of removing the remaining metal layer (see 330 of FIG. 3G) and titanium nitride layer (see 344 of FIG. 3G). This may be performed using a wet etch process.

FIG. 4A is a semiconductor structure 400 at a starting point for additional embodiments of the present invention, which pertain to removal of the n-type work function metal (nWFM) from the pFET trenches 424, 428. As stated previously, similar elements may be referred to by similar numbers in various figures (FIGs) of the drawing, in which case, typically the last two significant digits may be the same, the most significant digit being the number of the drawing figure (FIG). For example, substrate 102 of FIG. 1A may be similar to substrate 402 of FIG. 4A.

Semiconductor structure 400 comprises a plurality of trenches that are formed in the dielectric layer 404, which include an n-type field effect transistor (nFET) short channel trench (SCT) 422, p-type field effect transistor (pFET) SCT 424, nFET long channel trench (LCT) 426, and pFET LCT 428. A layer of high-K dielectric 416, and nWFM 414 line the trench 426 and 428. The high-K dielectric 416 is also in a lower, chamfered region 420 of trench 422 and trench 424, while the high-K dielectric and nWFM 414 are not present in an upper, non-chamfered region 418 of the trench 422 and trench 424.

FIG. 4B is a semiconductor structure 400 after a subsequent process step of depositing a titanium nitride layer 444 and metal layer 430. In embodiments, metal layer 430 comprises tungsten. The titanium nitride layer 444 deposits conformally on the long channel trenches 426 and 428. However, since the chamfered region 420 of the short channel trenches 422 and 424 are much narrower than the long channel trenches and have a much higher aspect ratio, the deposition of titanium nitride layer 444 fills the chamfered region 420 of trenches 422 and 424 (e.g., titanium nitride layer 444A in trench 422). Similarly, the metal layer 430 deposits conformally on the long channel trenches 426 and 428. However, since the short channel trenches 422 and 424 are much narrower than the long channel trenches and have a much higher aspect ratio, the deposition of metal layer 430 fills the trenches 422 and 424.

FIG. 4C is a semiconductor structure 400 after a subsequent process step of depositing a lithography stack. The lithography stack comprises OPL 442. Disposed on OPL 442 is an anti-reflective coating (ARC) layer 445. In embodiments, layer 445 is a silicon-containing anti-reflective coating (SiARC). In other embodiments, layer 445 is a titanium-containing anti-reflective coating (TiARC). Disposed on the ARC layer is a photoresist layer 446. The lithography stack is then opened over the PFET trenches 424 and 428, such that the photoresist layer 446 and ARC layer 445 are removed from over the PFET trenches 424 and 428. This may be accomplished using industry-standard patterning and lithographic techniques.

FIG. 4D is a semiconductor structure 400 after a subsequent process step of opening the lithography stack over the PFET trenches. The OPL is removed from over the PFET trenches 424 and 428. As a result, the metal layer 430 is exposed in the PFET trenches 424 and 428.

FIG. 4E is a semiconductor structure 400 after a subsequent process step of removing the organic planarization layer (see 430 of FIG. 4E) in the PFET trenches. As a result, opening 412 in trench 428 is formed. In embodiments, the removal of the organic planarization layer is performed with a reactive ion etch (RIE) process. The RIE process can damage the high-K dielectric, even if covered by the nWFM. However, in these embodiments, metal layer 430 provides additional protection during the RIE process, which can therefore serve to improve product yield. In embodiments, metal layer 430 comprises tungsten.

FIG. 4F is a semiconductor structure 400 after a subsequent process step of removing the metal layer (see 430 of FIG. 4E) in the PFET trenches. In embodiments, this is accomplished using a fluorine-based wet etch process.

FIG. 4G is a semiconductor structure 400 after a subsequent process step of removing the n-type work function metal (see 414 of FIG. 4F) in the PFET trenches. This may be performed using a wet etch process. As a result, the dielectric layer 416 is exposed in the PFET trenches 424 and 428.

FIG. 4H is a semiconductor structure after a subsequent process step of removing the remaining organic planarization layer, opening cavities 408, 410, and 412.

FIG. 4i is semiconductor structure 400 after a subsequent process step of depositing a p-type work function metal (pWFM) 447. In embodiments, the p-type work function metal (pWFM) is comprised of titanium nitride (TiN). As a result of the pWFM deposition, a pWFM region 447B is deposited in the chamfered region 420 of trench 424. Additionally, metal region 430C is encapsulated by TiN layer 444 and pWFM 447 in trench 426.

FIG. 4J is a semiconductor structure 400 after a subsequent process step of depositing a gate fill metal 437. After depositing the gate fill metal 437, the structure 400 may be planarized to make the gate fill metal 437 flush with the top of dielectric layer 404. In embodiments, the planarization may be performed using a chemical mechanical polish (CMP) process.

FIG. 4K is a semiconductor structure 400 after a subsequent process step of recessing the gate fill metal 437, opening cavities 406, 408, 410, and 412.

FIG. 4L is a semiconductor structure 400 after a subsequent process step of depositing a capping layer 448. In embodiments, capping layer 448 comprises silicon nitride. The capping layer may be planarized to be flush with the top of dielectric layer 404. In embodiments, the planarization may be performed using a chemical mechanical polish (CMP) process.

FIG. 5 is a flowchart 500 for embodiments of the present invention. In process step 550, a high-K dielectric layer is deposited in the short channel and long channel trenches. In process step 552, an n-type work function metal is deposited. The n-type work function metal (nWFM) may comprise titanium nitride, a multi-layer stack of various metals, or other suitable combinations of metals and dielectric layers. In process step 554, the structure is chamfered, such that the high-K dielectric is confined to a lower region of the short channel trenches. This is beneficial because the short channel trenches are so narrow that filling the high-aspect ratio shapes is challenging. Hence, the chamfering allows those trenches to be slightly wider in the upper portion, improving the ability to fill the trenches with metal or other materials without voids. In process step 556 a metal layer is deposited. In embodiments, the metal layer is tungsten. In process step 558, a first deposition of an organic planarization layer is performed. In process step 560, the metal layer is recessed. This serves to remove the metal layer from the sidewalls of the long channel trenches. In process step 562, additional OPL is deposited. In process step 564, the second OPL is partially recessed. In process step 566, the nWFM is recessed, such as is shown in FIG. 1 H. Thus, the metal regions protect the high-K dielectric in the long channel trenches, while OPL protects the high-K dielectric in the short channel trenches. Furthermore, the chamfering of the short channel work function metal (e.g., in trench 122 of FIG. 1H) is performed without the use of lithography steps, thereby saving cost and complexity in the fabrication process. From this point forward, industry-standard techniques may be used to complete the fabrication of the integrated circuit (IC).

FIG. 6 is a flowchart 600 for additional embodiments of the present invention, pertaining to details of the high-K chamfer process. In process step 650, a high-K dielectric is deposited. This may include hafnium oxide, zirconium oxide, or other high-K dielectric. In embodiments, the high-K dielectric is one where k>8. In process step 652, a high-K chamfering (HKC) metal layer is deposited. In process step 654, a high-K chamfering (HKC) organic planarization layer is deposited. In process step 656, the HKC metal layer is recessed. In process step 658, the HKC OPL is removed. In process step 660, the high-K dielectric layer is recessed, as is shown in FIG. 3H. Thus, the high-K chamfering process is performed without the use of lithography steps, thereby saving cost and complexity in the fabrication process.

As can now be appreciated, embodiments of the present invention provide improved structures and methods for fabrication of replacement metal gate transistors. Note that the embodiments may be performed in a sequence other than the order in which they are described herein. For example, the dielectric chamfering operation described in FIGS. 3A-3H may be performed first, followed by the nWFM chamfering as shown in FIGS. 1A-1Q and 2A-2J, followed by the nWFM removal as illustrated in FIGS. 4A-4L.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method of forming a semiconductor structure, comprising:
    forming an nFET short channel trench (SCT), a pFET SCT, an nFET long channel trench (LCT), and a pFET LCT in a dielectric layer that is disposed on a semiconductor substrate;
    depositing a high-K dielectric layer in the nFET SCT, the pFET SCT, the nFET LCT, and the pFET LCT;
    depositing an N type work function metal in the nFET SCT, the pFET SCT, the nFET LCT, and the pFET LCT;
    performing a high-K dielectric chamfer process on the nFET SCT and pFET SCT;
    depositing a metal layer in the nFET SCT, the pFET SCT, the nFET LCT, and the pFET LCT, such that the metal layer is deposited conformally in the nFET LCT and the pFET LCT, and wherein the metal layer fills the nFET SCT and the pFET SCT;
    depositing a first organic planarization layer in the nFET LCT and the pFET LCT;
    performing a recess of the metal layer; and
    depositing a second organic planarization layer in the nFET SCT, the pFET SCT, the nFET LCT, and the pFET LCT.

2. The method of claim 1, further comprising:
    performing a partial recess of the second organic planarization layer such that the second organic planarization layer is completely removed from the nFET LCT and the pFET LCT, while a portion of the second organic planarization layer remains in the nFET SCT and pFET SCT;
    performing a recess of the N type work function metal in the nFET SCT, the pFET SCT, the nFET LCT, and the pFET LCT; and
    removing the remaining portion of the second organic planarization layer.

3. The method of claim 2, wherein performing a high-K dielectric chamfer process comprises:
    depositing a High-K chamfering (HKC) metal layer in the nFET SCT, the pFET SCT, the nFET LCT, and the pFET LCT, such that the HKC metal layer is deposited conformally in the nFET LCT and the pFET LCT while filling the nFET SCT and the pFET SCT;
    depositing an HKC organic planarization layer in the nFET LCT and the pFET LCT;
    performing a recess of the HKC metal layer;
    removing the HKC organic planarization layer; and
    recessing the high-K dielectric layer.

4. The method of claim 1, wherein depositing the metal layer comprises depositing tungsten.

5. The method of claim 4, wherein performing the recess of the metal layer is performed with a fluorine-based etch.

6. The method of claim 3, wherein depositing the HKC metal layer comprises depositing tungsten.

7. The method of claim 1, wherein depositing the high-K dielectric layer comprises depositing hafnium oxide.

8. The method of claim 1, wherein depositing the high-K dielectric layer comprises depositing zirconium oxide.

9. The method of claim 2, further comprising:
depositing a first layer of titanium nitride (TiN) in the nFET SCT, the pFET SCT, the nFET LCT, and the pFET LCT;
depositing a first layer of tungsten in the nFET SCT, the pFET SCT, the nFET LCT, and the pFET LCT;
depositing an organic planarization layer over the nFET SCT and pFET SCT, and in the nFET LCT and in the pFET LCT;
removing the organic planarization layer from the pFET LCT and from over the pFET SCT;
performing a first tungsten recess to remove the first layer of tungsten from the pFET SCT and the pFET LCT;
removing the first layer of TiN from the pFET SCT and the pFET LCT;
removing the organic planarization layer from the nFET LCT and from over the nFET SCT;
depositing a second layer of TiN in the nFET SCT, the pFET SCT, the nFET LCT, and the pFET LCT
depositing a second layer of tungsten in the nFET SCT and pFET SCT and the nFET LCT, and the pFET LCT;
performing a second tungsten recess;
depositing a capping layer in the nFET SCT, the pFET SCT, the nFET LCT, and the pFET LCT; and
planarizing the capping layer.

10. The method of claim 9, wherein depositing the capping layer comprises depositing silicon nitride.

11. The method of claim 9, wherein performing the first tungsten recess comprises using a fluorine-based wet etch process.

12. A method of forming a semiconductor structure, comprising:
forming an nFET short channel trench (SCT), a pFET SCT, an nFET long channel trench (LCT) and a pFET LCT in a dielectric layer that is disposed on a semiconductor substrate;
depositing a high-K dielectric layer in the nFET SCT, the pFET SCT, the nFET LCT, and the pFET LCT;
depositing an N type work function metal in the nFET SCT, the pFET SCT, the nFET LCT, and the pFET LCT;
performing a high-K dielectric chamfer process on the nFET SCT and the pFET SCT;
depositing a metal layer in the pFET SCT, the pFET SCT, the nFET LCT, and the pFET LCT, such that the metal layer is deposited conformally in the nFET LCT and the pFET LCT while filling the pFET SCT and the pFET SCT;
depositing a first organic planarization layer in the nFET LCT and the pFET LCT;
performing a partial recess of the metal layer such that the remaining metal layer completely fills a non-chamfered region of the nFET SCT and the pFET SCT;
recessing the N type work function metal; and
removing the first organic planarization layer in the nFET LCT and the pFET LCT.

13. The method of claim 12, wherein performing a high-K dielectric chamfer process comprises:
depositing a high-K chamfering (HKC) metal layer in the nFET SCT, the pFET SCT, the nFET LCT, and the pFET LCT, such that the HKC metal layer is deposited conformally in the nFET LCT and the pFET LCT while filling the nFET SCT and the pFET SCT;
depositing a HKC organic planarization layer in the nFET LCT and the pFET LCT;
performing a recess of the HKC metal layer;
removing the HKC organic planarization layer; and
recessing the high-K dielectric layer.

14. The method of claim 12, further comprising:
depositing a first layer of titanium nitride in the nFET SCT, the pFET SCT, the nFET LCT, and the pFET LCT;
depositing a first layer of tungsten in the nFET SCT, the pFET SCT, the nFET LCT, and the pFET LCT;
depositing an organic planarization layer (OPL) over the nFET SCT and the pFET SCT and in the nFET LCT and in the pFET LCT;
removing the OPL from the pFET LCT and from over the pFET SCT;
performing a first tungsten recess to remove the first layer of tungsten from the pFET SCT and the pFET LCT;
removing the first layer of titanium nitride from the pFET SCT and the pFET LCT;
removing the OPL from the pFET LCT and from over the nFET SCT;
depositing a second layer of titanium nitride in the nFET SCT, the pFET SCT, the nFET LCT, and the pFET LCT;
depositing a second layer of tungsten in the pFET SCT, the pFET SCT, the nFET LCT, and the pFET LCT;
performing a recess of the second layer of tungsten;
depositing a capping layer in the nFET SCT, the pFET SCT, the nFET LCT, and the pFET LCT; and
planarizing the capping layer.

15. The method of claim 14, wherein depositing the capping layer comprises depositing silicon nitride.

16. The method of claim 14, wherein performing the first tungsten recess comprises using a fluorine-based wet etch process.

* * * * *